United States Patent
Okada

(10) Patent No.: US 10,186,418 B2
(45) Date of Patent: Jan. 22, 2019

(54) SUBSTRATE PROCESSING METHOD AND SUBSTRATE PROCESSING APPARATUS

(71) Applicant: SCREEN Holdings Co., Ltd., Kyoto (JP)

(72) Inventor: Yoshifumi Okada, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 545 days.

(21) Appl. No.: 14/624,853

(22) Filed: Feb. 18, 2015

(65) Prior Publication Data

US 2015/0243536 A1   Aug. 27, 2015

(30) Foreign Application Priority Data

Feb. 25, 2014 (JP) ................................. 2014-033770

(51) Int. Cl.
*H01L 21/02* (2006.01)
*H01L 21/67* (2006.01)

(52) U.S. Cl.
CPC .... *H01L 21/02041* (2013.01); *H01L 21/6715* (2013.01); *H01L 21/67167* (2013.01); *H01L 21/67276* (2013.01)

(58) Field of Classification Search
CPC ........... H01L 21/02041; H01L 21/6715; H01L 21/67167; H01L 21/67276
See application file for complete search history.

(56) References Cited

U.S. PATENT DOCUMENTS 8,160,736 B2 * 4/2012 Krisnamuthi .......... G06Q 10/06
                                                        700/112
8,630,733 B2    1/2014 Itou
(Continued)

FOREIGN PATENT DOCUMENTS

CN    1787197 A    6/2006
CN    102034731    4/2011
(Continued)

OTHER PUBLICATIONS

Chinese Office Action dated May 4, 2017 issued for Chinese counterpart (Application No. 201510087840.0) of the present application with English partial translation based on Japanese translation of same.
(Continued)

*Primary Examiner* — Mikhail Kornakov
*Assistant Examiner* — Natasha N Campbell
(74) *Attorney, Agent, or Firm* — Ostrolenk Faber LLP

(57) ABSTRACT

For execution of substrate processing using multiple processing units available in parallel, two or more processing units to be used in parallel are selected from the multiple processing units such that an conveying-out standby time does not exceed a given permissible time. The conveying-out standby time is a time when a substrate after subjected to substrate processing by the processing unit is placed in standby until the substrate is transported from the processing unit by a transporting part. A schedule is made that includes processing by the transporting part of transporting a substrate toward the two or more processing units, substrate processing by the two or more processing units, and processing by the transporting part of transporting a substrate from the two or more processing units. The processing unit and the transporting part are controlled to execute substrate processing on multiple substrates in order according to the schedule.

11 Claims, 25 Drawing Sheets

(56) References Cited

U.S. PATENT DOCUMENTS

| | | | |
|---|---|---|---|
| 8,757,180 B2 | 6/2014 | Mitsuyoshi | ................... 134/151 |
| 8,909,364 B2 | 12/2014 | Tsukinoki | |
| 2006/0266290 A1 | 11/2006 | Kiyota | |
| 2011/0076120 A1* | 3/2011 | Itou | ................... H01L 21/67184 |
| | | | 414/222.13 |
| 2011/0292356 A1 | 12/2011 | Tsukinoki et al. | |
| 2014/0099176 A1* | 4/2014 | Nogi | ................. H01L 21/67276 |
| | | | 414/217 |

FOREIGN PATENT DOCUMENTS

| | | |
|---|---|---|
| CN | 102270562 A | 12/2011 |
| JP | 3934275 | 6/2007 |
| JP | 2008-198884 | 8/2008 |
| JP | 2010-129603 A | 6/2010 |

OTHER PUBLICATIONS

Taiwan Office Action issued for Taiwan Application No. 104104618 dated Nov. 27, 2017 with English partial translation of the Office Action based on Japanese translation.

Japanese Decision of Grant (Application No. 2014-033770) dated Jan. 16, 2018.

Office Action dated Jul. 2, 2018 in counterpart Taiwan Patent Application No. 104104618 with Japanese translation and English partial translation based on the Japanese translation.

* cited by examiner

F I G. 2
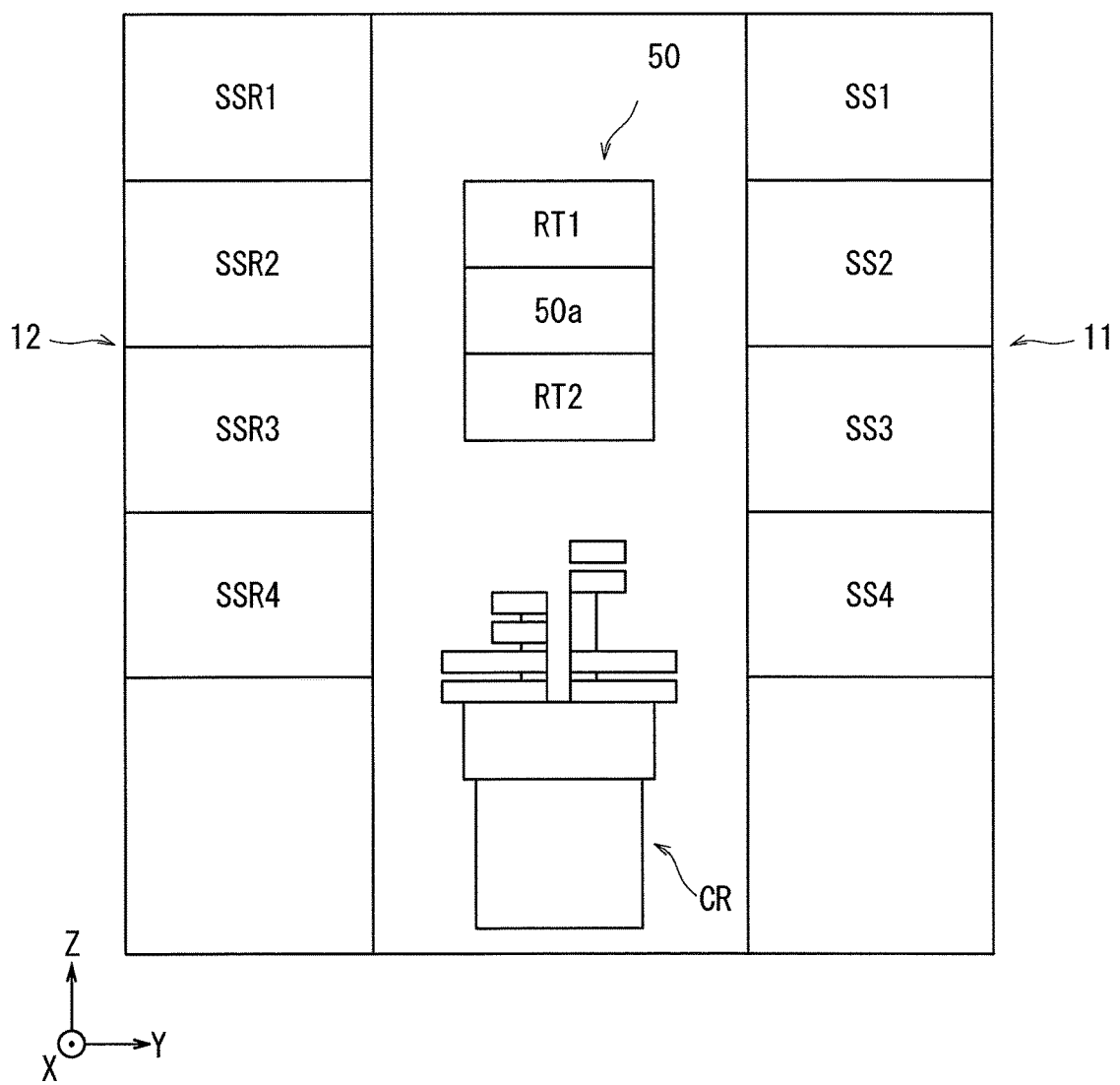

FIG. 12A
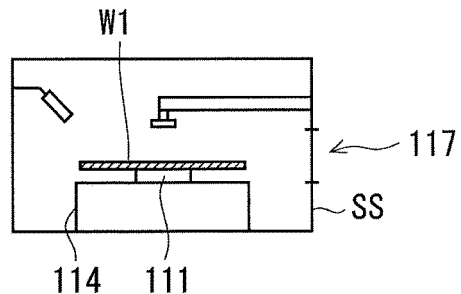 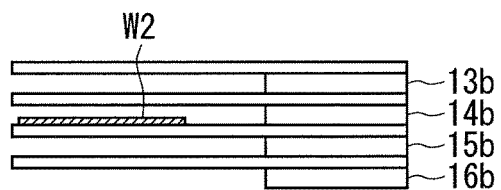
FIG. 12B
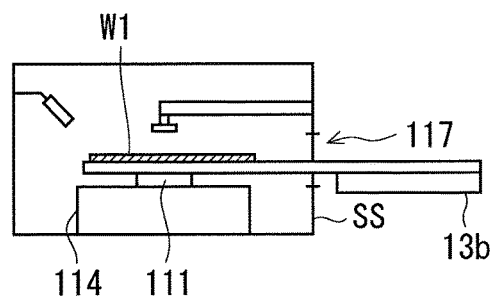 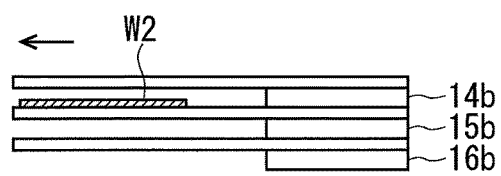
FIG. 12C
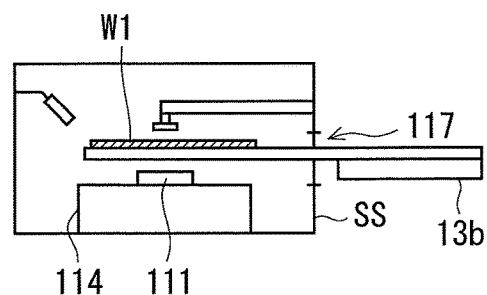 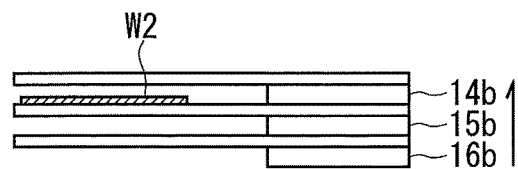
FIG. 12D
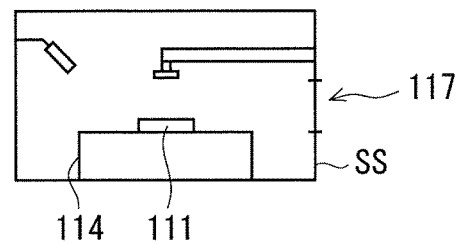 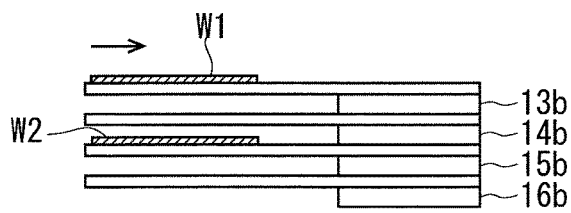

FIG. 13A
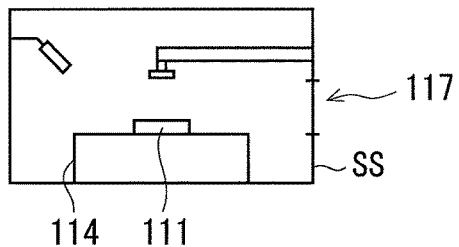
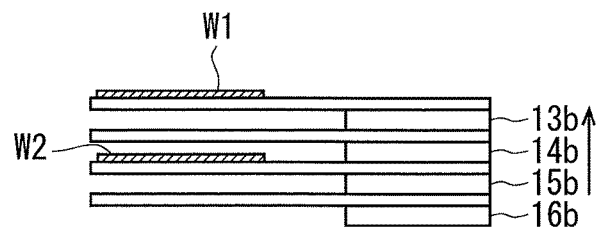
FIG. 13B
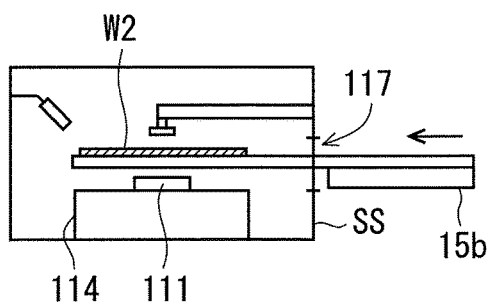
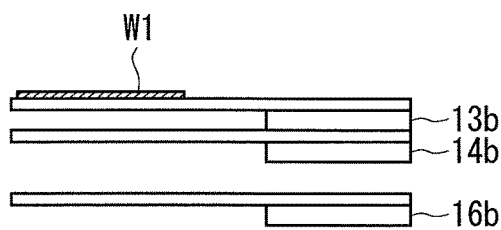
FIG. 13C
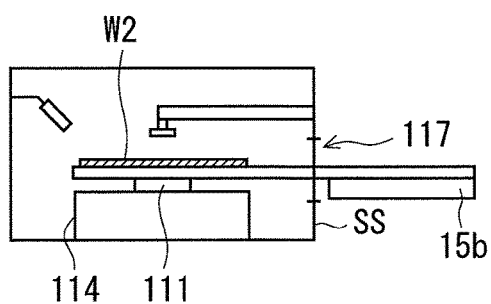
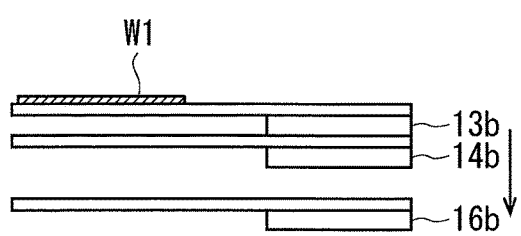
FIG. 13D
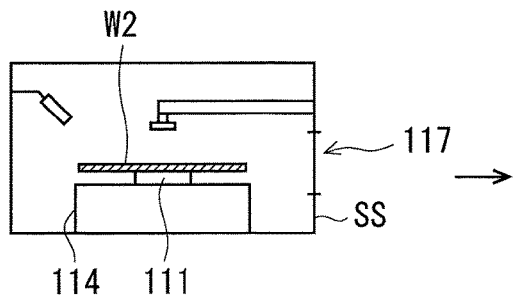
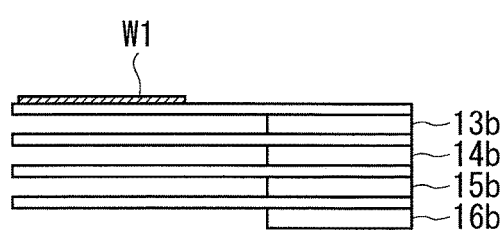

F I G. 15

| | S1 | S2 | S3 | S4 | S5 | S6 | S7 | S8 | S9 | S10 | S11 | S12 | S13 |
|---|---|---|---|---|---|---|---|---|---|---|---|---|---|
| FIRST PATTERN "CLEANING OF ONLY FRONT SURFACE" | C | IR | PASS3 | CR | SS (FRONT) | CR | — | — | — | — | PASS1 | IR | C |
| SECOND PATTERN "CLEANING OF ONLY REAR SURFACE" | C | IR | RT2 (FROM FRONT TO REAR) | CR | SSR (REAR) | CR | — | — | — | — | RT2 (FROM REAR TO FRONT) | IR | C |
| THIRD PATTERN (CLEANING OF BOTH SURFACES (REAR SURFACE FIRST AND THEN FRONT SURFACE)) | C | IR | RT2 (FROM FRONT TO REAR) | CR | SSR (REAR) | CR | RT1 (FROM REAR TO FRONT) | CR | SS (FRONT) | CR | PASS1 | IR | C |
| FOURTH PATTERN (CLEANING OF BOTH SURFACES (FRONT SURFACE FIRST AND THEN REAR SURFACE)) | C | IR | PASS3 | CR | SS (FRONT) | CR | RT1 (FROM FRONT TO REAR) | CR | SSR (REAR) | CR | RT2 (FROM REAR TO FRONT) | IR | C |

F I G. 1 6

| FLOW RECIPE FR1 | STEP | PROCESSING UNIT | UNIT RECIPE | | |
|---|---|---|---|---|---|
| | | | PRE -PROCESSING | SUBSTRATE PROCESSING | POST PROCESSING |
| | STEP 1 | SS1 | — | UNIT RECIPE 1 | — |
| | | SS2 | — | UNIT RECIPE 1 | — |
| | | SS3 | — | UNIT RECIPE 1 | — |
| | | SS4 | — | UNIT RECIPE 1 | — |

F I G. 1 7

| FLOW RECIPE FR2 | STEP | PROCESSING UNIT | UNIT RECIPE | | |
|---|---|---|---|---|---|
| | | | PRE -PROCESSING | SUBSTRATE PROCESSING | POST PROCESSING |
| | STEP 1 | SS1 | — | UNIT RECIPE 2 | — |
| | | SS2 | — | UNIT RECIPE 2 | — |
| | | SS3 | — | UNIT RECIPE 2 | — |
| | | SS4 | — | UNIT RECIPE 2 | — |

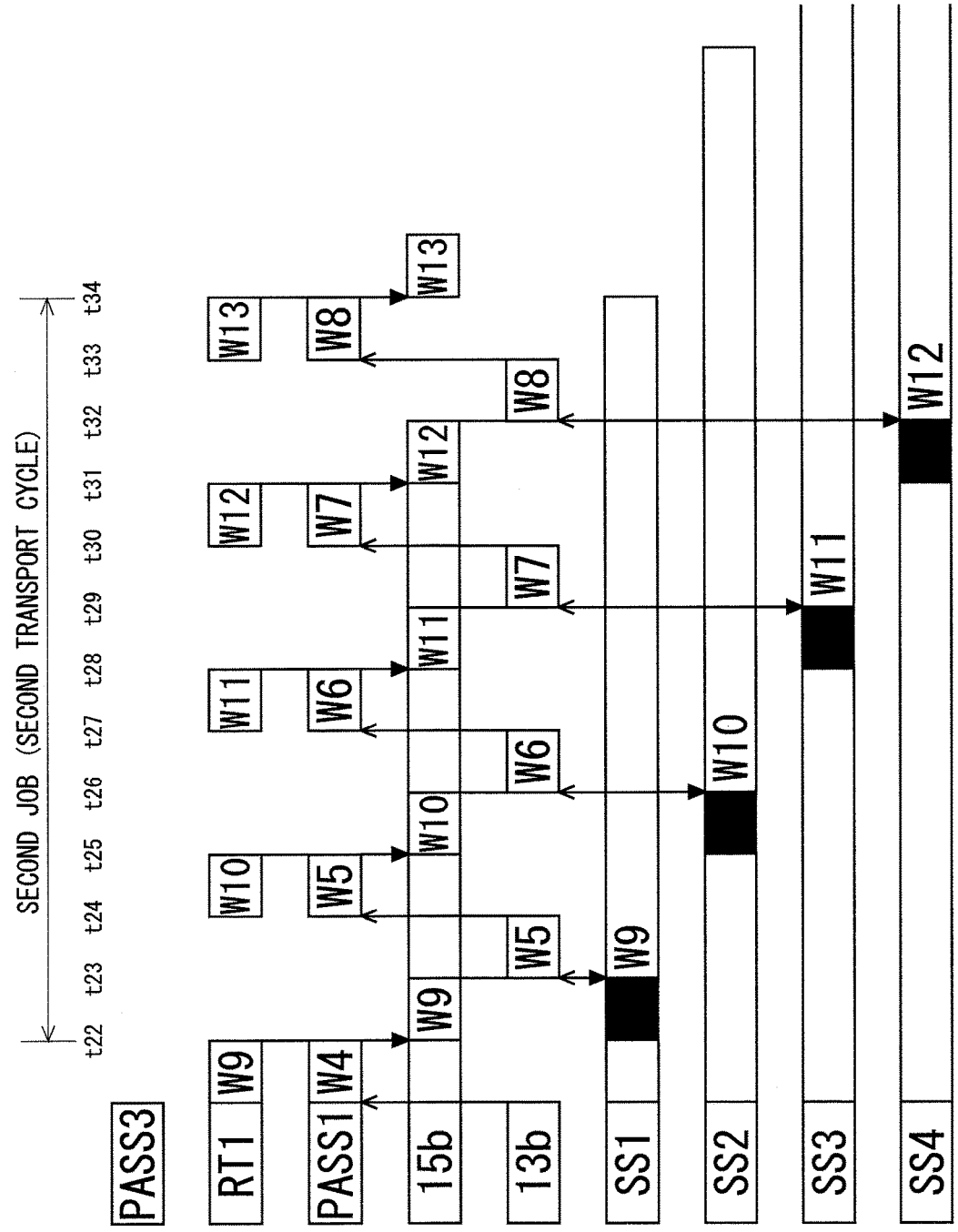

F I G. 2 6
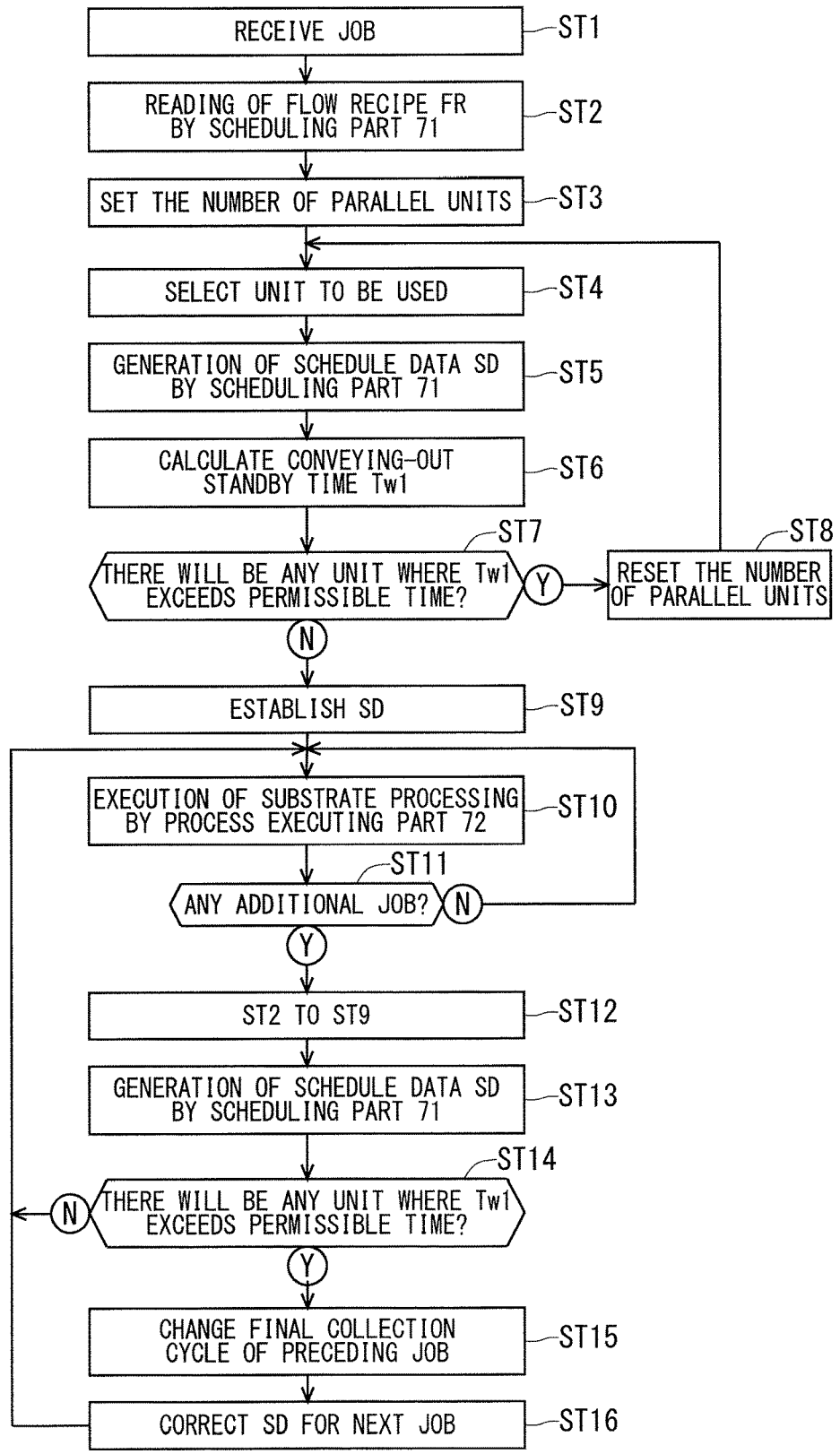

SUBSTRATE PROCESSING METHOD AND SUBSTRATE PROCESSING APPARATUS

BACKGROUND OF THE INVENTION

Field of the Invention

The present invention relates a substrate processing method and a substrate processing apparatus used for processing a semiconductor substrate, a glass substrate for a liquid crystal display, a glass substrate for a photomask, and a substrate for an optical disk (hereinafter simply called a "substrate"), for example. The present invention particularly relates to improvement in a process of transporting a substrate.

Description of the Background Art

Japanese Patent Application Laid-Open No. 2008-198884 discloses a substrate processing apparatus including multiple processing units that process substrates one by one, and a transport robot that transports a substrate to and from each processing unit. In this substrate processing apparatus, the multiple processing units process substrates in parallel for increasing the throughput of the apparatus.

In the substrate processing apparatus disclosed in Japanese Patent Application Laid-Open No. 2008-198884, multiple substrates can be processed in parallel by the multiple processing units. However, the technique disclosed in Japanese Patent Application Laid-Open No. 2008-198884 is merely intended to increase a throughput by simply using the multiple processing units in parallel. Japanese Patent Application Laid-Open No. 2008-198884 is completely silent about a technique about selection of a processing unit showing how a processing unit should be selected in detail. As described later, the present inventors have found that if processing units to be used in parallel are selected merely in terms of increasing a throughput, a processed substrate might be left unattended for a long time in a processing unit, possibly adversely affecting the quality of substrate processing.

SUMMARY OF THE INVENTION

The present invention is intended for a substrate processing apparatus with multiple substrate processing units available in parallel and a substrate transporting part that transports a substrate to the multiple substrate processing units and transports a substrate after subjected to substrate processing from the multiple substrate processing units The substrate processing apparatus includes: a selecting part that selects two or more substrate processing units to be used in parallel from the multiple substrate processing units such that a conveying-out standby time does not exceed a given permissible time, the conveying-out standby time being a time when a substrate after subjected to substrate processing by a substrate processing unit of the multiple substrate processing units is placed in standby until the substrate is transported from the substrate processing unit by the substrate transporting part; a schedule making part that makes a substrate processing schedule including processing by the substrate transporting part of transporting a substrate toward the two or more substrate processing units to be used in parallel, substrate processing by the two or more substrate processing units to be used in parallel, and processing by the substrate transporting part of transporting a substrate from the two or more substrate processing units to be used in parallel; and a controller that controls the multiple substrate processing units and the substrate transporting part to execute substrate processing on multiple substrates in order according to the substrate processing schedule made by the schedule making part.

A substrate after subjected to substrate processing can be prevented from being left unattended in the substrate processing unit for a time longer than the permissible time. This prevents exposure of the substrate after subjected to the substrate processing to mist of a processing liquid for the substrate processing or the like for a long time, so that degradation of the performance of the substrate processing can be prevented or suppressed.

Preferably, the substrate transporting part is to transport multiple substrates in order to the two or more substrate processing units to be used in parallel. While the controller controls the multiple substrate processing units and the substrate transporting part according to a substrate processing schedule defining a transport cycle to be repeated when a substrate is transported to each of the two or more substrate processing units to be used in parallel, the schedule making part makes a substrate processing schedule of a subsequent transport cycle during execution of a preceding transport cycle and before start of the subsequent transport cycle.

A substrate processing schedule can be changed in parallel with execution of substrate processing.

Preferably, the substrate processing apparatus further includes a substrate supporting part that supports the substrate. The substrate transporting part is to move back and forth between the substrate supporting part supporting the substrate and the multiple substrate processing units. The schedule making part sets a second number to be smaller than a first number and makes the substrate processing schedule based on the second number if the substrate transporting part executes the preceding transport cycle and the subsequent transport cycle continuously and if the substrate transporting part takes a longer time to move back and forth between the substrate supporting part and the multiple substrate processing units in the subsequent transport cycle than in the preceding transport cycle. The first number is the number of two or more substrate processing units to be used in parallel in the preceding transport cycle. The second number is the number of two or more substrate processing units to be used in parallel in the subsequent transport cycle.

This can offer appropriate handling of transport cycles to be executed continuously that involve different times for moving back and forth between the substrate supporting part and the substrate processing unit.

The present invention is also intended for a substrate processing method implemented in a substrate processing apparatus with multiple substrate processing units available in parallel and a substrate transporting part that transports a substrate to the multiple substrate processing units and transports a substrate after subjected to substrate processing from the multiple substrate processing units. The substrate processing method includes the steps of: (a) selecting two or more substrate processing units to be used in parallel from the multiple substrate processing units such that a conveying-out standby time does not exceed a given permissible time, the conveying-out standby time being a time when a substrate after subjected to substrate processing by a substrate processing unit of the multiple substrate processing units is placed in standby until the substrate is transported from the substrate processing unit by the substrate transporting part; (b) making a substrate processing schedule including processing by the substrate transporting part of transporting a substrate toward the two or more substrate processing units to be used in parallel, substrate processing by the two or more substrate processing units to be used in parallel, and processing by the substrate transporting part of transporting a substrate from the two or more substrate processing units to be used in parallel; and (c) controlling the multiple substrate processing units and the substrate transporting part to execute substrate processing on multiple substrates in order according to the substrate processing schedule.

A substrate after subjected to substrate processing can be prevented from being left unattended in the substrate processing unit for a time longer than the permissible time. This prevents exposure of the substrate after subjected to the substrate processing to mist of a processing liquid for the substrate processing or the like for a long time, so that degradation of the performance of the substrate processing can be prevented or suppressed.

Preferably, the substrate transporting part is to transport multiple substrates in order to the two or more substrate processing units to be used in parallel. While the multiple substrate processing units and the substrate transporting part are controlled according to a substrate processing schedule defining a transport cycle to be repeated when a substrate is transported to each of the two or more substrate processing units to be used in parallel, a substrate processing schedule of a subsequent transport cycle is made during execution of a preceding transport cycle and before start of the subsequent transport cycle.

A substrate processing schedule can be changed in parallel with execution of substrate processing.

Preferably, the substrate transporting part is to move back and forth between a substrate supporting part supporting the substrate and the multiple substrate processing units. A second number is set to be smaller than a first number and the substrate processing schedule is made based on the second number if the substrate transporting part executes the preceding transport cycle and the subsequent transport cycle continuously and if the substrate transporting part takes a longer time to move back and forth between the substrate supporting part and the multiple substrate processing units in the subsequent transport cycle than in the preceding transport cycle. The first number is the number of two or more substrate processing units to be used in parallel in the preceding transport cycle. The second number is the number of two or more substrate processing units to be used in parallel in the subsequent transport cycle.

This can offer appropriate handling of transport cycles to be executed continuously that involve different times for moving back and forth between the substrate supporting part and the substrate processing unit.

According to a different aspect of the present invention, a substrate processing method is implemented in a substrate processing apparatus with multiple substrate processing units available in parallel and a substrate transporting part that transports a substrate to and from the multiple substrate processing units. This substrate processing method includes the steps of: (A) setting the number of two or more substrate processing units to be used in parallel so as to produce a transport rate limiting condition where the length of a staying time of the substrate in each of the multiple substrate processing units does not exceed a time required for one transport cycle by the substrate transporting part; (B) making a substrate processing schedule based on the number of the substrate processing units to be used in parallel; (C) calculating a conveying-out standby time when a substrate after subjected to substrate processing by a substrate processing unit of the multiple substrate processing units according to the substrate processing schedule is placed in standby until the substrate is transported from the substrate processing unit by the substrate transporting part; (D) resetting the number of the two or more substrate processing units to be used in parallel if the conveying-out standby time exceeds a permissible time and correcting the substrate processing schedule based on the reset number of two ore more substrate processing units to be used in parallel; and (E) controlling the multiple substrate processing units and the substrate transporting part to execute substrate processing on multiple substrates in order according to the substrate processing schedule corrected in the step (D).

A substrate after subjected to substrate processing can be prevented from being left unattended in the substrate processing unit for a time longer than the permissible time. This prevents exposure of the substrate after subjected to the substrate processing to mist of a processing liquid for the substrate processing or the like for a long time, so that degradation of the performance of the substrate processing can be prevented or suppressed.

Thus, in terms of increasing not only a throughput but also a substrate processing quality, it is one object of the present invention to provide a technique of making a substrate processing schedule according to which processing units to be used in parallel can be selected appropriately and a substrate can be transported to and from the selected processing units.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 are side views of a processing zone 3 common to all the embodiments;

FIGS. 12A to 12D and FIGS. 13A to 13D are conceptual views showing substrate transfer between the center robot CR and the cleaning unit common to all the embodiments;

FIG. 15 is a table showing an exemplary substrate transport pattern that can be adopted by the substrate processing apparatus 1;

FIG. 16 is a diagram showing a data structure of a flow recipe FR1 common to all the embodiments;

FIG. 17 is a diagram showing a data structure of a flow recipe FR2 common to all the embodiments;

FIGS. 24 and 25 are timing diagrams both showing an idea of changing a substrate processing schedule according to a third preferred embodiment;

FIG. 26 is a flowchart showing a flow of substrate processing according to the third preferred embodiment.

DESCRIPTION OF THE PREFERRED EMBODIMENTS

Embodiments of the present invention are described in detail below by referring to the accompanying drawings.

First Preferred Embodiment

1. Outline of Structure of Substrate Processing Apparatus 1

Figure 1:
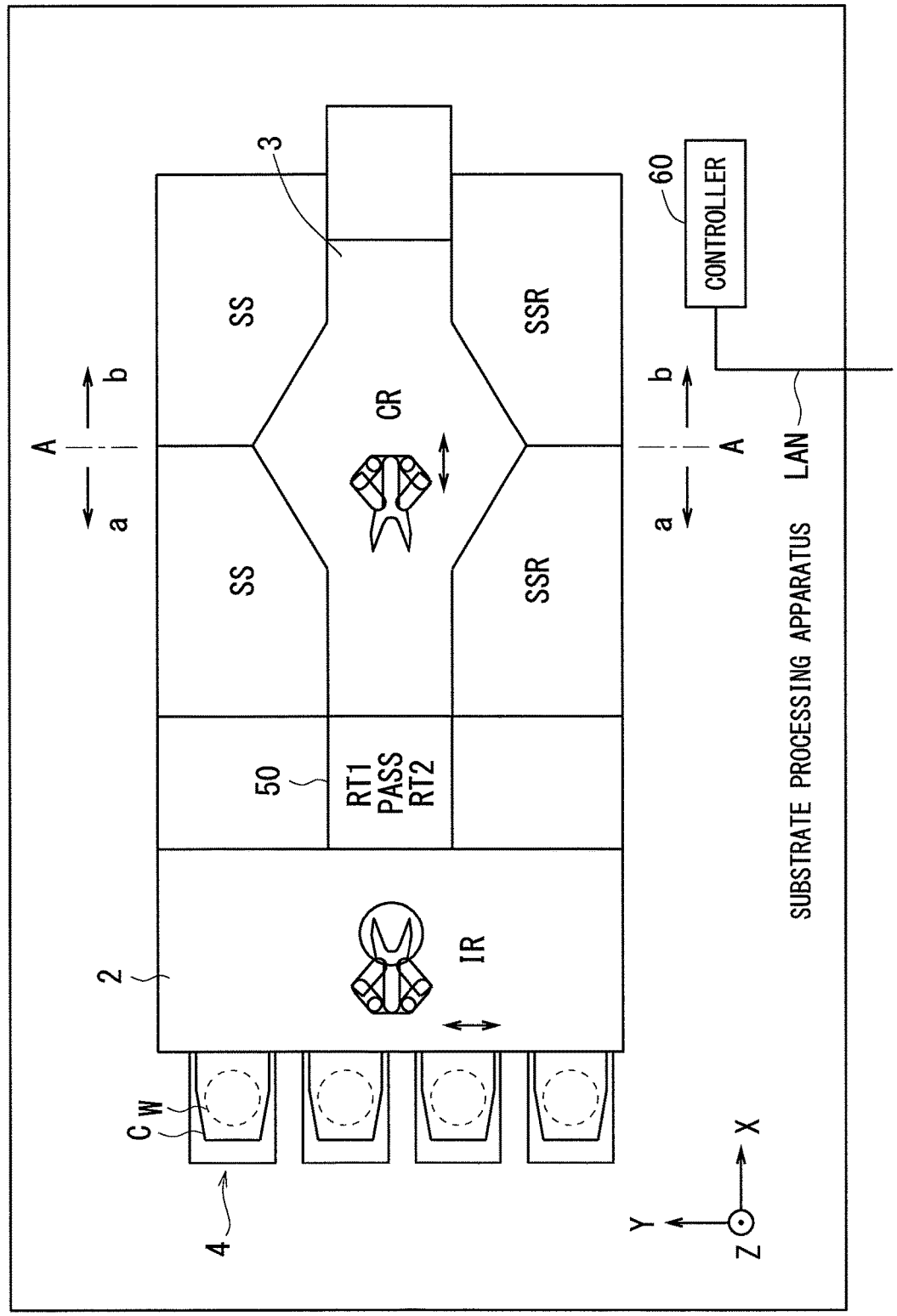
FIG. 1 is a schematic view showing an overall structure of a substrate processing apparatus 1 common to all embodiments.
Figure 3:
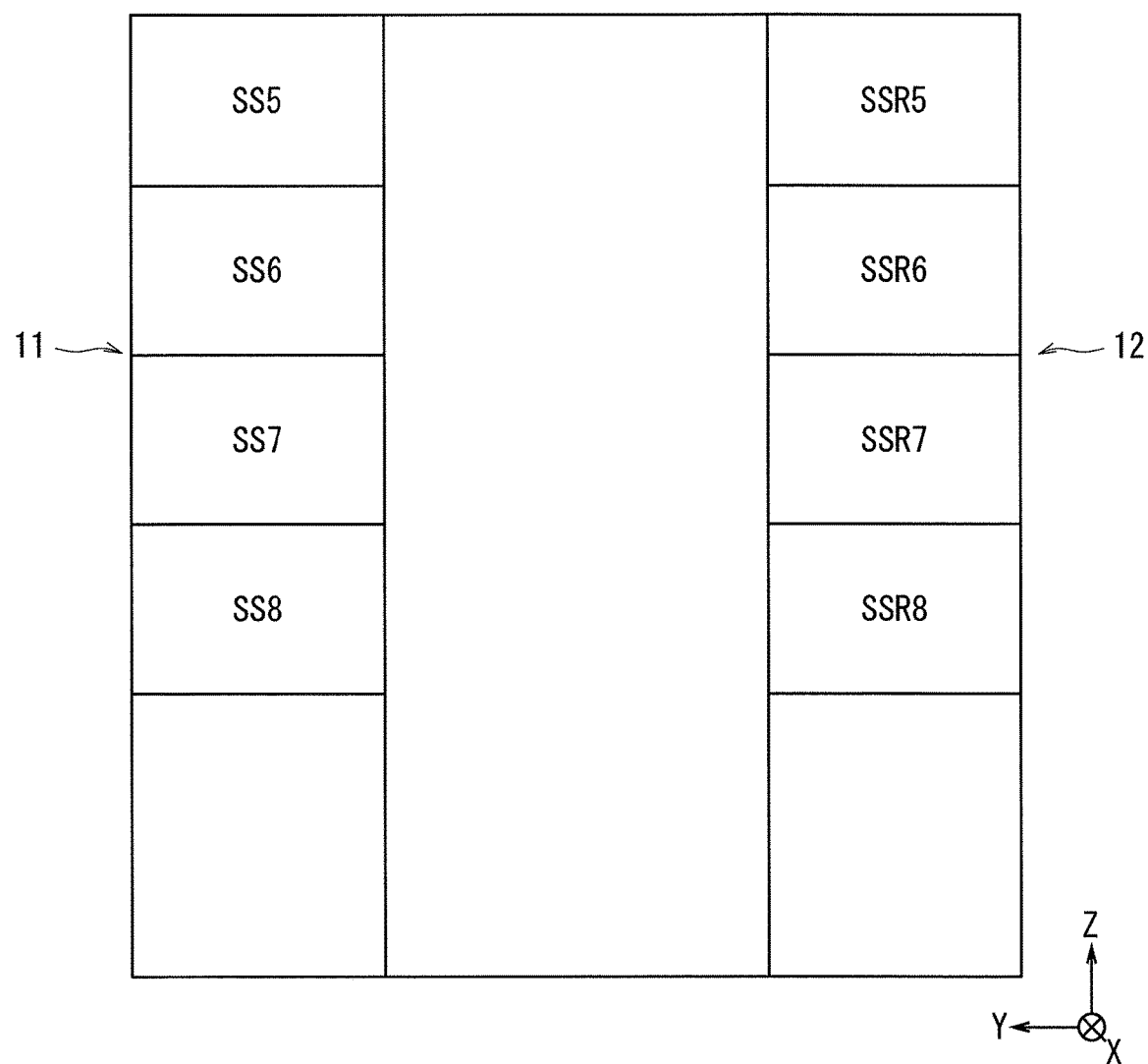

FIG. 1 is a plan view showing the layout of a substrate processing apparatus 1 according to a first preferred embodiment of the present invention. FIG. 2 is a side view of the substrate processing apparatus 1 taken along a section A-A of FIG. 1 as viewed in the direction of an arrow a. FIG. 3 is a side view of the substrate processing apparatus 1 taken along the section A-A of FIG. 1 as viewed in the direction of an arrow b. In the drawings accompanying this specification, an X direction and a Y direction are two-dimensional coordinate axes defining a horizontal plane, and a Z direction defines a vertical direction perpendicular to the XY plane.

The substrate processing apparatus 1 is a sheet-type substrate cleaning apparatus that processes substrates W such as semiconductor wafers one by one. As shown in FIG. 1, the substrate processing apparatus 1 includes an indexer zone 2 and a processing zone 3 coupled to the indexer zone 2. An intermediary section 50 is arranged at a boundary between the indexer zone 2 and the processing zone 3. The intermediary section 50 is formed of an intermediary unit 50a for transferring a substrate W between an indexer robot IR and a center robot CR, a reversing unit (RT1) for reversing the substrate W for transfer of the substrate W to and from the center robot CR, and a reversing and transferring unit (RT2) for transferring a substrate W between the indexer robot IR and the center robot CR while reversing the substrate W. As shown in FIG. 2, the intermediary section 50 has a stacked structure with the reversing unit RT1 arranged on the intermediary unit 50a and the reversing and transferring unit RT2 arranged below the intermediary unit 50a.

The substrate processing apparatus 1 includes a controller 60 for control of the behavior of each device in the substrate processing apparatus 1. The processing zone 3 is a zone for substrate processing such as scrub cleaning process described later. The substrate processing apparatus 1 as a whole functions as a sheet-type substrate cleaning apparatus.

The controller 60 is connected through a LAN to a host computer prepared outside the substrate processing apparatus 1. The host computer transmits a flow recipe FR, that determines the substance of transport of each substrate W in the substrate processing apparatus 1 and the substance of substrate processing by a front surface processing unit SS and a rear surface processing unit SSR, to the controller 60. By referring to the received flow recipe FR, the controller 60 makes a transport schedule of each substrate W inside the substrate processing apparatus 1 and a schedule of substrate processing by the front surface processing unit SS and the rear surface processing unit SSR.

As described in detail later, in the substrate processing apparatus 1 of the first preferred embodiment, the controller 60 has a computer program stored in advance used for making a schedule of processing or transporting each substrate in the form of digital data. A computer forming the controller 60 executes this computer program, thereby realizing a schedule making device as one function of the controller 60.

<1.1 Indexer Zone>

The indexer zone 2 is a zone where a substrate W (unprocessed substrate W) received from outside the substrate processing apparatus 1 is transported to the processing zone 3 and a substrate W (processed substrate W) received from the processing zone 3 is transported to the outside of the substrate processing apparatus 1.

The indexer zone 2 includes a carrier holding part 4 capable of holding a carrier C where multiple substrates W can be housed, the indexer robot IR functioning as a transporting part of a substrate, and an indexer robot moving mechanism 15 (hereinafter called an "IR moving mechanism 15") that moves the indexer robot IR horizontally.

The carrier C can hold multiple substrates W horizontally arranged one above the other and spaced at regular intervals. The carrier C holds multiple substrates W while a front surface (one of two main surfaces where an electronic device is to be formed) of each of the substrates W is pointed upward. Multiple carriers C are held by corresponding carrier holding parts 4 while being arranged in a given direction (in the first preferred embodiment, Y direction). The IR moving mechanism 15 can move the indexer robot IR horizontally in the Y direction.

The carrier C housing an unprocessed substrate W is transported from outside the apparatus for example by an OHT (overhead hoist transfer) or an AGV (automated guided vehicle) to each carrier holding part 4 and is then placed on the carrier holding part 4. A processed substrate W after subjected to substrate processing such as scrub cleaning process in the processing zone 3 is transferred from the center robot CR to the indexer robot IR via the intermediary section 50, and is again housed in the carrier C on the carrier holding part 4. The carrier C housing the processed substrate W is transported for example by the OHT to the outside of the apparatus. Specifically, the carrier holding part 4 functions as a substrate collecting part of collecting an unprocessed substrate W and a processed substrate W.

The structure of the IR moving mechanism 15 in the first preferred embodiment is described below. A movable table is fixed to the indexer robot IR. The movable table is threadedly engaged with a ball screw extending in the Y direction parallel to the arrangement of the carriers C. The movable table is arranged in a manner that allows the movable table to make sliding motion freely along a guide rail. Thus, if the ball screw is rotated by a rotary motor, the movable table and the indexer robot IR fixed to the movable table entirely move horizontally along the Y-axis direction (all of these motions are not shown in the drawings).

In this way, the indexer robot IR is allowed to move freely in the Y direction. Thus, the indexer robot IR is allowed to move to a position where a substrate can be transported to and from each carrier C or the intermediary section 50 (in the below, conveying-in and conveying-out of a substrate may be called "access" in some cases).

Figure 4:
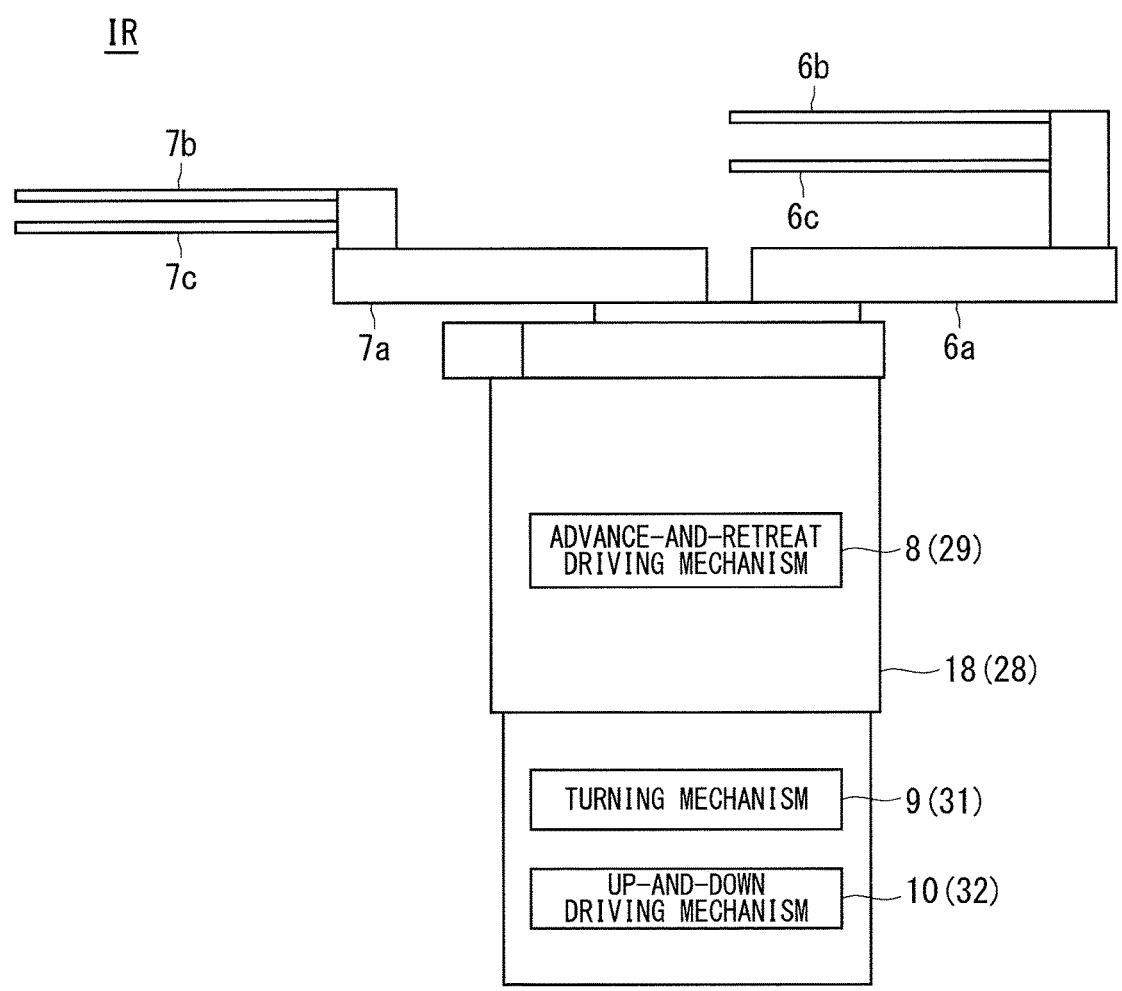
FIG. 4 is a schematic view showing the structure of an indexer robot IR common to all the embodiments.

FIG. 4 is a graphic side view of the indexer robot IR. A reference sign given to each element of FIG. 4 and shown in parentheses is a reference sign for an element of the center robot CR if the robot mechanism of the center robot CR has the substantially same degree of freedom as that of the robot mechanism of the indexer robot IR. Thus, the description of the indexer robot IR given herein makes reference to a reference sign outside parentheses.

The indexer robot IR has a base 18. One end of an arm 6*a* and one end of an arm 7*a* are attached to the base 18. Hands 6*b*, 6*c* and hands 7*b*, 7*c* are arranged on the other ends of the respective arms such that the hands 6*b*, 6*c* and hands 7*b*, 7*c* are displaced from each other in height in the vertical direction so as to prevent the interference each other (in FIG. 1, the hands 6*b* and 6*c* and the hands 7*b* and 7*c* overlap with each other in the vertical direction).

As a result, the hands 6*b* and 6*c* are held by the base 18 via the arm 6*a*, whereas the hands 7*b* and 7*c* are held by the base 18 via the arm 7*a*.

Each of the hands 6*b*, 6*c*, 7*b*, and 7*c* has a tip formed as fingers in a pair. Specifically, the tip of each of the hands 6*b*, 6*c*, 7*b*, and 7*c* is formed like a bifurcated fork as viewed from above. Each of the tips of the hands 6*b*, 6*c*, 7*b*, and 7*c* can hold one substrate W horizontally by supporting the lower surface of the substrate W from below. In the first preferred embodiment, the hands 7*b* and 7*c* are used for transport of only an unprocessed substrate before subjected to cleaning process, whereas the hands 6*b* and 6*c* are used for transport of only a processed substrate after subjected to cleaning process. The outer size of the fingers in a pair of each hand is smaller than a gap between opposite support members 54 in a pair of the intermediary section 50 (FIG. 9) described later. This allows each of the hands 6*b*, 6*c*, 7*b*, and 7*c* to transport a substrate W to and from the intermediary section 50 without interfering with the support members 54 during conveying-in and conveying-out of a substrate described later.

The outer size of the fingers in a pair of each of the hands 6*b*, 6*c*, 7*b*, and 7*c* is smaller than the diameter of a substrate W. Thus, a substrate W can be held stably with each of the hands 6*b*, 6*c*, 7*b*, and 7*c*. The indexer robot IR is a robot mechanism with the four hands 6*b*, 6*c*, 7*b*, and 7*c* that can transport up to two unprocessed substrates simultaneously and up to two processed substrates simultaneously.

Each of the arms 6*a* and 7*a* is an articulated bending and stretching arm. The indexer robot IR can make an advance-and-retreat driving mechanism 8 expand and contract the arms 6*a* and 7*a* individually. This allows the hands 6*b* and 6*c* corresponding to the arm 6*a* and the hands 7*b* and 7*c* corresponding to the arm 7*a* to separately advance and retreat horizontally. The base 18 includes a built-in turning mechanism 9 for rotating the base 18 around a vertical axis line, and a built-in up-and-down driving mechanism 10 for moving the base 18 up and down in the vertical direction.

The aforementioned structure allows the IR moving mechanism 15 to move the indexer robot IR freely in the Y direction. The turning mechanism 9 and the up-and-down driving mechanism 10 can change the angle of each hand of the indexer robot IR in a horizontal plane and change the height of each hand of the indexer robot IR in the vertical direction.

Thus, each of the hands 6*b*, 6*c*, 7*b*, and 7*c* of the indexer robot IR is allowed to face the carrier C and the intermediary section 50. While the hands 6*b* and 6*c* and the hands 7*b* and 7*c* face the carrier C, the indexer robot IR expands the arm 6*a* or 7*a*, thereby allowing the hands 6*b* and 6*c* corresponding to the arm 6*a* and the hands 7*b* and 7*c* corresponding to the arm 7*a* to access this carrier C or the intermediary section 50.

<1.2 Processing Zone>

The processing zone 3 is a zone where an unprocessed substrate W transported from the indexer zone 2 is subjected to cleaning process and a processed substrate W after subjected to the cleaning process is returned to the indexer zone 2.

The processing zone 3 includes a front surface cleaning processor 11 that cleans the front surfaces of substrates W one by one, a rear surface cleaning processor 12 that cleans the rear surfaces of substrates W one by one, the center robot CR functioning as a transporting part of a substrate, and a center robot moving mechanism 17 (hereinafter called a "CR moving mechanism 17") that moves the center robot CR horizontally. The structure of each device in the processing zone 3 is described below.

As shown in FIGS. 1 to 3, the front surface cleaning processor 11 has two groups including a group of front surface cleaning units SS1 to SS4 and a group of front surface cleaning units SS5 to SS8. The front surface cleaning units in each group are stacked one above the other in four tiers. The rear surface cleaning processor 12 has two groups including a group of rear surface cleaning units SSR1 to SSR4 and a group of rear surface cleaning units SSR5 to SSR8. The rear surface cleaning units in each group are stacked one above the other in four tiers.

As shown in FIG. 1, the front and rear surface cleaning processors 11 and 12 are juxtaposed and separated by a given distance in the Y direction. The center robot CR is arranged between the front and rear surface cleaning processors 11 and 12.

Figure 5:
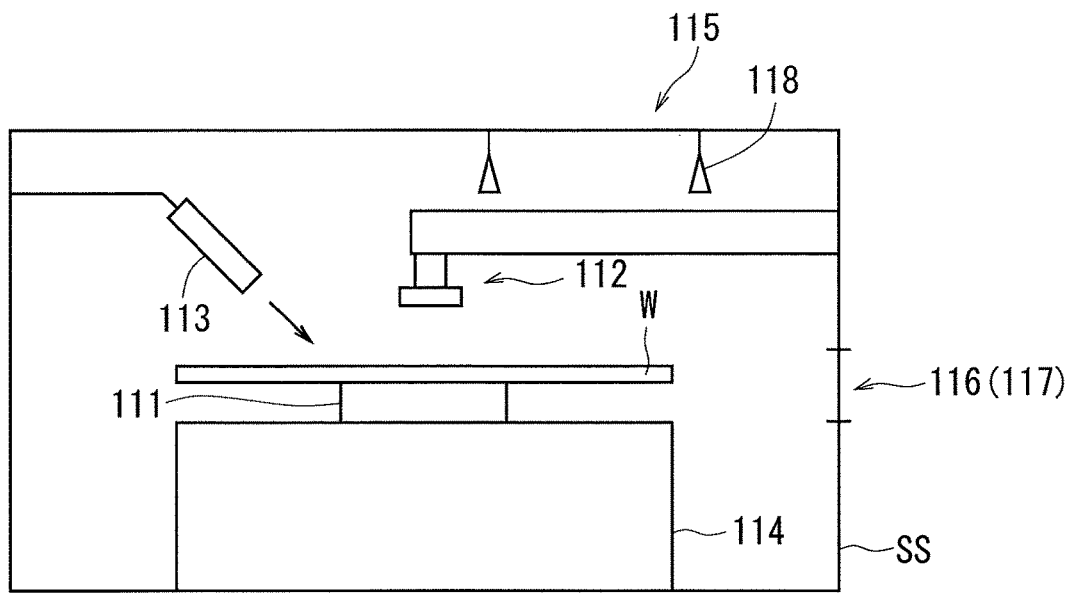
FIG. 5 is a schematic view showing the structure of a cleaning unit common to all the embodiments.

FIG. 5 shows scrub cleaning process on the front surface of a substrate W in each of the cleaning units SS1 to SS8. The cleaning units SS1 to SS8 each include a spin chuck 111 to hold a substrate W and rotate the substrate W around a core extending in the vertical direction while placing the substrate W in a horizontal posture with the front surface thereof pointed upward, a cleaning brush 112 to abut on or get close to the front surface of the substrate W held on the spin chuck 111 for scrub cleaning process, a nozzle 113 from which a cleaning liquid (such as pure water) is discharged to the front surface of the substrate W, a spin rotation support 114 to rotate the spin chuck 111, a cup (not shown in the drawings) surrounding the periphery of the substrate W held on the spin chuck 111, and a unit case 115 housing these members. The unit case 115 is provided with a gate 117 with a slit 116 that can be opened and closed by sliding through which a substrate W is transported to and from the unit case 115.

A top plate or a side plate of each of the cleaning units SS1 to SS8 is provided with a unit cleaning liquid nozzle 118 from which a cleaning liquid is discharged for cleaning the inside of each of the units SS1 to SS8.

The rear surface cleaning processor 12 performs scrub cleaning process on the rear surface of a substrate W. Like the front surface cleaning units SS1 to SS8, the rear surface cleaning units SSR1 to SSR8 each include a spin chuck, a cleaning brush, a nozzle, a spin motor, a cup, a unit case housing these members, and a unit cleaning liquid nozzle. The unit case is provided with a gate with a slit that can be opened and closed through which a substrate W is transported to and from the unit case (all of these members are not shown in the drawings).

The spin chuck 111 in each of the front surface cleaning units SS1 to SS8 may adopt a vacuum suction system of holding a substrate W from its rear surface. Meanwhile, it is preferable that the spin chuck 111 in each of the rear surface cleaning units SSR1 to SSR8 adopt a system of mechanically gripping an edge portion of a substrate W as this spin chuck 111 is to hold the substrate W from its front surface.

For cleaning the front surface of a substrate W with the cleaning brush 112, a brush moving mechanism not shown in the drawings moves the cleaning brush 112 to a position above a substrate W held on the spin chuck 111 with the front surface thereof pointed upward. Then, a processing liquid (such as pure water (deionized water)) is supplied from the nozzle 113 onto the upper surface of the substrate W while the spin chuck 111 rotates the substrate W and the cleaning brush 112 is made to contact the upper surface of the substrate W. With the cleaning brush 112 contacting the upper surface of the substrate W, the cleaning brush 112 is moved along the upper surface of the substrate W. As a result, the upper surface of the substrate W is scanned with the cleaning brush 112, so that the entire front surface of the substrate W can be subjected to scrub cleaning process. In this way, the front surface of the substrate W is processed. The rear surface of the substrate W is cleaned in the same way.

After cleaning the substrate W, rinsing process is performed to replace the cleaning liquid on the front surface of the substrate W with a rinsing liquid. Next, drying process is performed to remove the rinsing liquid from the substrate W by rotating the substrate W at a high speed, for example.

Although not shown in the drawings, a sensor to detect abnormality in the nozzle 113, the spin chuck 111, or the spin rotation support 114 is provided in any part of the cleaning unit SS (SSR).

A procedure of standard processes including the cleaning process, the ringing process, and the drying process performed by the cleaning unit SS (SSR) and conditions for these processes are determined in advance as a unit recipe. A storage 64 of the controller 60 described later has a unit recipe database UDB storing multiple unit recipes. Each unit recipe is given a unique recipe number. An operator can make a unit recipe by operating an input part 66. Alternatively, a unit recipe can be given from the host computer to the controller 60 through a LAN 65 and then stored in the unit recipe database UDB.

In the first preferred embodiment, the cleaning units SS1 to SS8 and SSR1 to SSR8 in the cleaning processors 11 and 12 are described as devices to perform scrub cleaning on a substrate W. Meanwhile, the scrub cleaning is not the only substrate processing performed by the cleaning units SS1 to SS8 and SSR1 to SSR8 in the cleaning processors 11 and 12. As an example, each of the cleaning units SS1 to SS8 and SSR1 to SSR8 may be a cleaning unit to clean substrates W one by one with a fluid such as a processing liquid (such as a cleaning liquid or a rinsing liquid) or a gas discharged for example from a nozzle facing the front surface or the rear surface of a substrate without using a brush.

Figure 6:
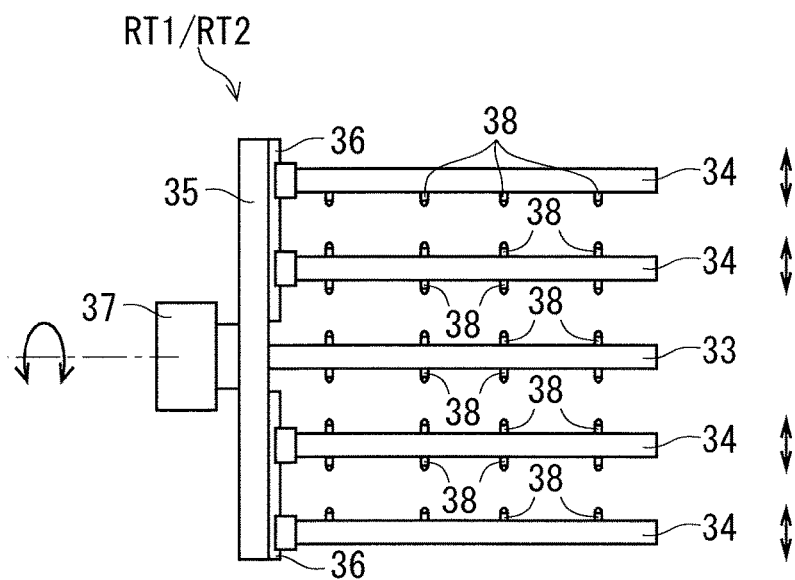
FIG. 6 is a schematic view showing the structure of a reversing unit RT common to all the embodiments.

FIG. 6 is a graphic side view of the reversing unit RT1 and the reversing and transferring unit RT2. The reversing unit RT1 and the reversing and transferring unit RT2 differ only in that the former is accessible only from the center robot CR, whereas the latter is accessible not only from the center robot CR but also from the indexer robot IR. Thus, the reversing unit RT1 and the reversing and transferring unit RT2 are both described by referring to FIG. 6.

The reversing unit RT1 is a processing unit to perform reversing process on a substrate W transported to the reversing unit RT1 by the center robot CR. After the reversing unit RT1 reverses the substrate W, the center robot CR transports this substrate W from the reversing unit RT1.

The reversing and transferring unit RT2 is accessible both from the indexer robot IR and the center robot CR. After the indexer robot IR transports a substrate W to the reversing and transferring unit RT2, the reversing and transferring unit RT2 reverses this substrate W. Then, the center robot CR transports this reversed substrate W from the reversing and transferring unit RT2. After the center robot CR transports a substrate W to the reversing and transferring unit RT2, the reversing and transferring unit RT2 reverses this substrate W. Then, the indexer robot IR transports this reversed substrate W from the reversing and transferring unit RT2.

In the substrate processing apparatus 1 of the first preferred embodiment, each of the cleaning units SS1 to SS8 and SSR1 to SSR8 in the front surface cleaning processors 11 and 12 performs cleaning process on the upper surface of a substrate. (The upper surface is irrelevant to the front or rear side of a substrate. A side facing upward in the vertical direction at the time of the process is called an upper surface, whereas a side facing downward in the vertical direction at the time of the process is called a lower surface.) Thus, for cleaning process on both surfaces of a substrate, for example, not only the cleaning process on a substrate W but also reversing process on the substrate W becomes necessary. The reversing unit RT1 and the reversing and transferring unit RT2 are used for this reversal.

As shown in FIG. 6, the reversing unit RT includes a fixed plate 33 arranged horizontally, and four movable plates 34 arranged horizontally while holding the fixed plate 33 between the movable plates 34 from above and below. The fixed plate 33 and the movable plates 34 each have a rectangular shape and are arranged to overlap each other in a plan view. The fixed plate 33 is fixed to a support plate 35 in a horizontal posture. The movable plates 34 are each attached to the support plate 35 in a horizontal posture via a guide 36 extending in the vertical direction.

The movable plates 34 are each movable in the vertical direction relative to the support plate 35. The movable plates 34 are each moved in the vertical direction by an actuator such as an air cylinder not shown in the drawings. A rotary actuator 37 is attached to the support plate 35. The fixed plate 33 and the four movable plates 34 are rotated integrally together with the support plate 35 around a horizontal rotary axis line by the rotary actuator 37. The rotary actuator 37 can turn the fixed plate 33 and the four movable plates 34 upside down by rotating the support plate 35 180 degrees about the horizontal rotary axis line.

Multiple support pins 38 are attached to each of surfaces facing each other out of surfaces of the fixed plate 33 and the four movable plates 34 (as an example, the lower surface of the movable plate 34 above the fixed plate 33 and the upper surface of the fixed plate 33). The multiple support pins 38 are spaced at appropriate intervals on a corresponding surface around a circumference corresponding to the outer circumferential shape of a substrate W. The height of each support pin 38 (length from a base end toward a tip) is constant. This height is greater than the thickness (length in the vertical direction) of the hands 6b and 6c, 7b and 7c, and hands 13b to 16b.

The fixed plate 33 can support one substrate W horizontally in a position above the fixed plate 33 via the multiple support pins 38. Each of the four movable plates 34 can support one substrate W horizontally in a position above this movable plate 34 via the multiple support pins 38 when this movable plate 34 is below the substrate W. A gap in the vertical direction between the position where the fixed plate 33 supports a substrate and the position where the movable plate 34 supports a substrate is set to be the same as a gap in the vertical direction between two substrates W held by the hands 6b and 6c or 7b and 7c of the indexer robot IR and a gap in the vertical direction between two substrates W held by corresponding ones of the hands 13b to 16b of the center robot CR.

As a result of the aforementioned structure of the reversing unit RT1, the center robot CR can make a substrate W held by each of the hands 13b to 16b access the reversing unit RT1 (can transport the substrate W to and from the reversing unit RT1). As a result of the aforementioned structure of the reversing and transferring unit RT2, the indexer robot IR and the center robot CR (in the below, the indexer robot IR and the center robot CR may be called collectively as "robots IR and CR") can make a substrate W held by each of the hands 6b and 6c, 7b and 7c, and 13b to 16b access the reversing and transferring unit RT2 (can transport the substrate W to and from the reversing and transferring unit RT2). Transfer of a substrate W is described in detail later.

The indexer robot IR or the center robot CR inserts a first substrate W in a gap between the fixed plate 33 and the movable plate 34 directly above the fixed plate 33 and a second substrate W in a gap between this movable plate 34 and the movable plate 34 still above the former movable plate 34. In this condition, these two movable plates 34 are moved toward the fixed plate 33, so that these two substrates W can be held by the reversing unit RT1 or the reversing and transferring unit RT2. Likewise, a first substrate W can be held in a gap between the fixed plate 33 and the movable plate 34 directly below the fixed plate 33 and a second substrate W can be held in a gap between this movable plate 34 and the movable plate 34 still below the former movable plate 34.

While the substrates W are held in the reversing unit RT, the rotary actuator 37 rotates the support plate 35 around the horizontal rotary axis line. As a result, the two substrates W being held can be turned upside down. As described above, the reversing unit RT1 and the reversing and transferring unit RT2 can hold multiple substrates W (in the first preferred embodiment, two substrates W) horizontally and turn the held substrates W upside down.

The structure of the CR moving mechanism 17 is the same as that of the aforementioned IR moving mechanism 15. Specifically, the CR moving mechanism 17 is formed of members not shown in the drawings including a movable table, a ball screw extending lengthwise in the X direction, a guide rail, and a rotary motor to rotate the ball screw. The rotation of the ball screw makes the entire center robot CR fixed to the movable table moves horizontally in the X direction inside the processing zone 3 while crossing space between the front and rear surface cleaning processors 11 and 12. In this way, the center robot CR becomes freely movable in the X direction, so that the center robot CR can move to a position that allows access (conveying-in and conveying-out) to each of the cleaning units SS1 to SS8 and SSR1 to SSR8. The center robot CR can also move to a position that allows access (conveying-in and conveying-out) to the intermediary section 50.

The center robot CR can be a robot mechanism of a structure substantially the same as that of the indexer robot IR of FIG. 4, specifically a structure where vertically arranged two groups each including hands in two tiers fixed relative to each other are allowed to advance and retreat independently (in the below, this mechanism is called a "2A4H mechanism" indicating a mechanism with "arms in two groups and four hands"). The center robot CR may have a difference structure. The center robot CR adopting a robot of the 2A4H mechanism includes components same as those shown in FIG. 4 described relating to the indexer robot IR, so that these components are not described here repeatedly.

Figure 7A:
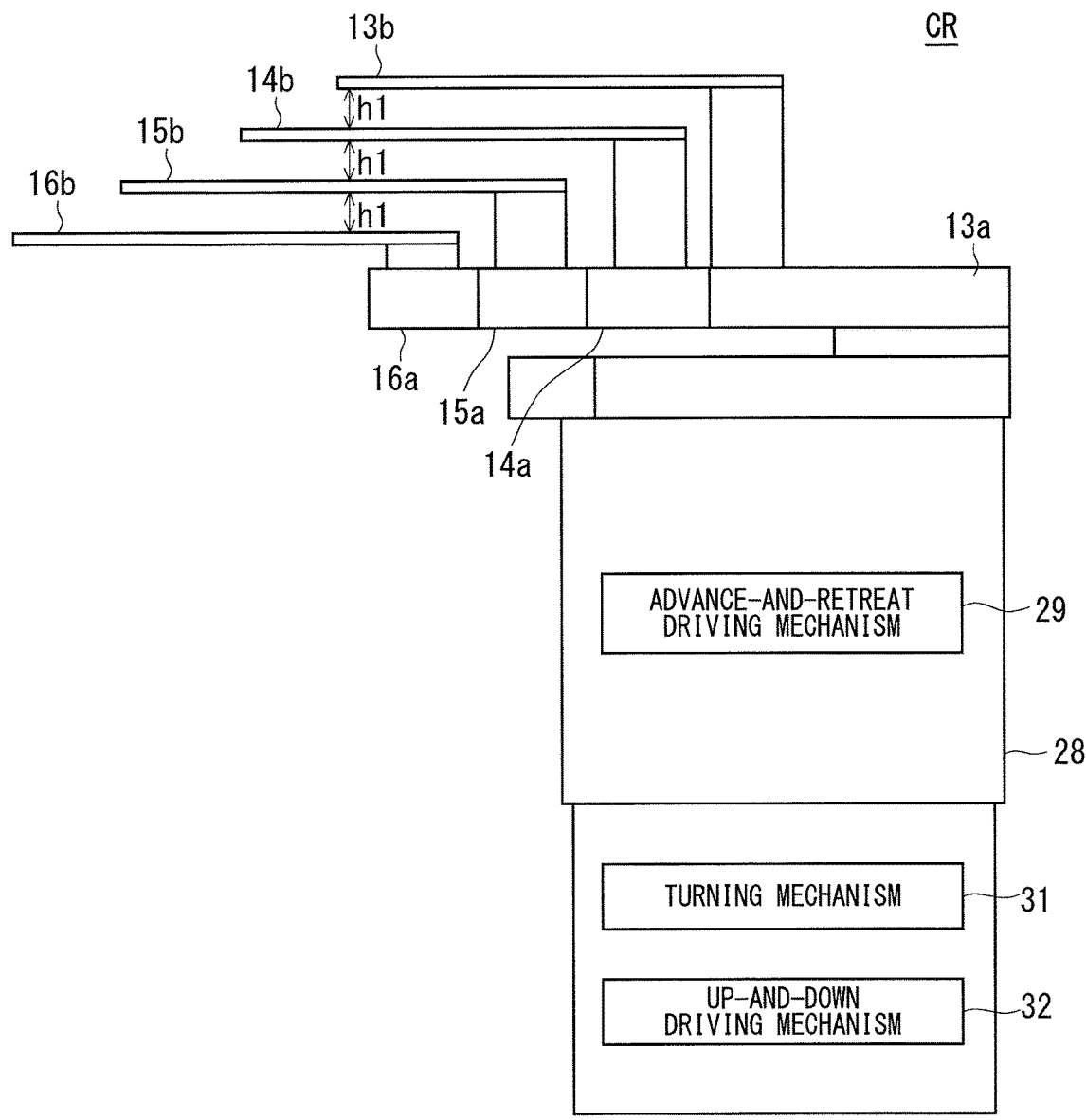
FIGS. 7A and 7B are schematic views showing the structure of a center robot CR common to all the embodiments.
Figure 7B:
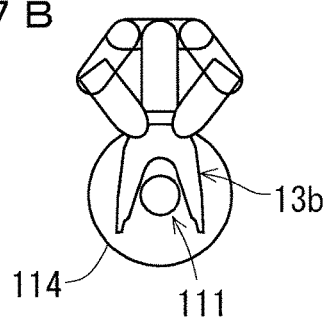

FIG. 7A is a graphic side view of the center robot CR configured such that four arms 13a to 16a enable advancing and retreating of the four hands 13b to 16b respectively (hereinafter called a "4A4H mechanism"). FIG. 7B is a graphic top view showing how the center robot CR accesses the cleaning unit SS (SSR) during conveying-in and conveying-out of a substrate described later.

As shown in FIG. 7A, the center robot CR of the 4A4H mechanism includes a base 28. The arms 13a to 16a each have one end attached to the base 28. Respective opposite ends of the arms 13a to 16a are attached to the hands 13b to 16b respectively. As a result, the hands 13b to 16b are held by the base 28 via the arms 13a to 16a respectively.

The hands 13b to 16b are arranged one above the other at different heights (spaced by the same distance h1 in the vertical direction) such that adjacent ones of the hands 13b to 16b do not interfere with each other. Each of the hands 13b to 16b has a tip formed as fingers in a pair. Specifically, the tip of each of the hands 13b to 16b is formed like a bifurcated fork as viewed from above. Each of the hands 13b to 16b can hold one substrate W horizontally by supporting the lower surface of the substrate W from below. In the first preferred embodiment, the hands 15b and 16b are used for transport of only an unprocessed substrate before subjected to cleaning process, whereas the hands 13b and 14b are used for transport of only a processed substrate after subjected to cleaning process.

The outer size of the fingers in a pair of each of the hands 13b to 16b is smaller than a gap between opposite support pins 55 in a pair of the intermediary section 50. This allows each of the hands 13b to 16b to prevent interference with the support members 54 of the intermediary section 50 during conveying-in and conveying-out of a substrate described later.

A member passage region is formed between the fingers in a pair of each of the hands 13b to 16b. This region is larger than the spin chuck 111 in the cleaning unit SS (SSR). This allows each of the hands 13b to 16b to prevent interference with the spin chuck 111 during conveying-in and conveying-out of a substrate described later. (see FIG. 7B). The thickness of each of the hands 13b to 16b is smaller than a gap between the upper surface of the spin chuck 111 and the upper surface of the spin rotation support 114. Each of the arms 13a to 16a is an articulated bending and stretching arm. The center robot CR can make an advance-and-retreat driving mechanism 29 expand and contract the arms 13a to 16a individually. This allows the hands 13b to 16b corresponding to the arms 13a to 16a respectively to separately move horizontally. The base 28 includes a built-in turning mechanism 31 for rotating the base 28 around the vertical axis line, and a built-in up-and-down driving mechanism 32 for moving the base 28 up and down in the vertical direction.

The CR moving mechanism 17 moves the center robot CR to a position where the center robot CR is accessible to each of the cleaning units SS1 to SS8 and SSR1 to SSR8.

Then, the turning mechanism 31 rotates the base 28 to rotate each of the hands 13b to 16b around a certain vertical axis line. Meanwhile, the up-and-down driving mechanism 32 moves the base 28 up and down in the vertical direction. As a result, an arbitrary one of the hands 13b to 16b is allowed to face a desired one of the cleaning units SS1 to SS8 and SSR1 to SSR8. While one of the hands 13b to 16b faces a cleaning unit, a corresponding one of the arms 13a to 16a is expanded, thereby allowing one of the hands 13b to 16b corresponding to this arm to access this cleaning unit. The center robot CR can make an arbitrary one of the hands 13b to 16b access the intermediary section 50 in the same way.

According to both the 2A4H mechanism and the 4A4H mechanism adopted by the center robot CR, up to two unprocessed substrates can be transported together (simultaneously) from the intermediary section 50 to each of the processing units SS1 to SS8 and SSR1 to SSR8 and up to two processed substrates can be transported together from each of the processing units SS1 to SS8 and SSR1 to SSR8 to the intermediary section 50. The 2A4H mechanism and the 4A4H mechanism achieve the same maximum number of substrates that can be transported together. For the convenience of description, the center robot CR adopting the 4A4H mechanism is used in the following description. Meanwhile, the respective behaviors of the arms of the center robot CR adopting the 2A4H mechanism can be understood based on the analogy with the arm behavior of the indexer robot IR.

In the foregoing description, each of the hands 13b to 16b of the center robot CR is allowed to access the processing units SS and SSR and the intermediary section 50 by combined use of the CR moving mechanism 17. Alternatively, using only the turning mechanism 31, the up-and-down driving mechanism 32, and the advance-and-retreat driving mechanism 29 of the center robot CR without using the CR moving mechanism 17 can certainly make each of the hands 13b to 16b of the center robot CR access the processing units SS and SSR and the intermediary section 50.

A sensor to detect abnormality in the respective behaviors of the IR moving mechanism 15, the indexer robot IR, the CR moving mechanism 17, and the center robot CR is provided to each part of these mechanisms.

<1.3 Intermediary Unit 50a>

The intermediary unit 50a for transfer of a substrate W between the indexer robot IR and the center robot CR is arranged at a boundary between the indexer zone 2 and the processing zone 3. The intermediary unit 50a is a casing housing substrate placement parts PASS1 to PASS4. For transfer of a substrate W between the indexer robot IR and the center robot CR, the substrate W is temporarily placed in the substrate placement parts PASS1 to PASS4.

Figure 8:
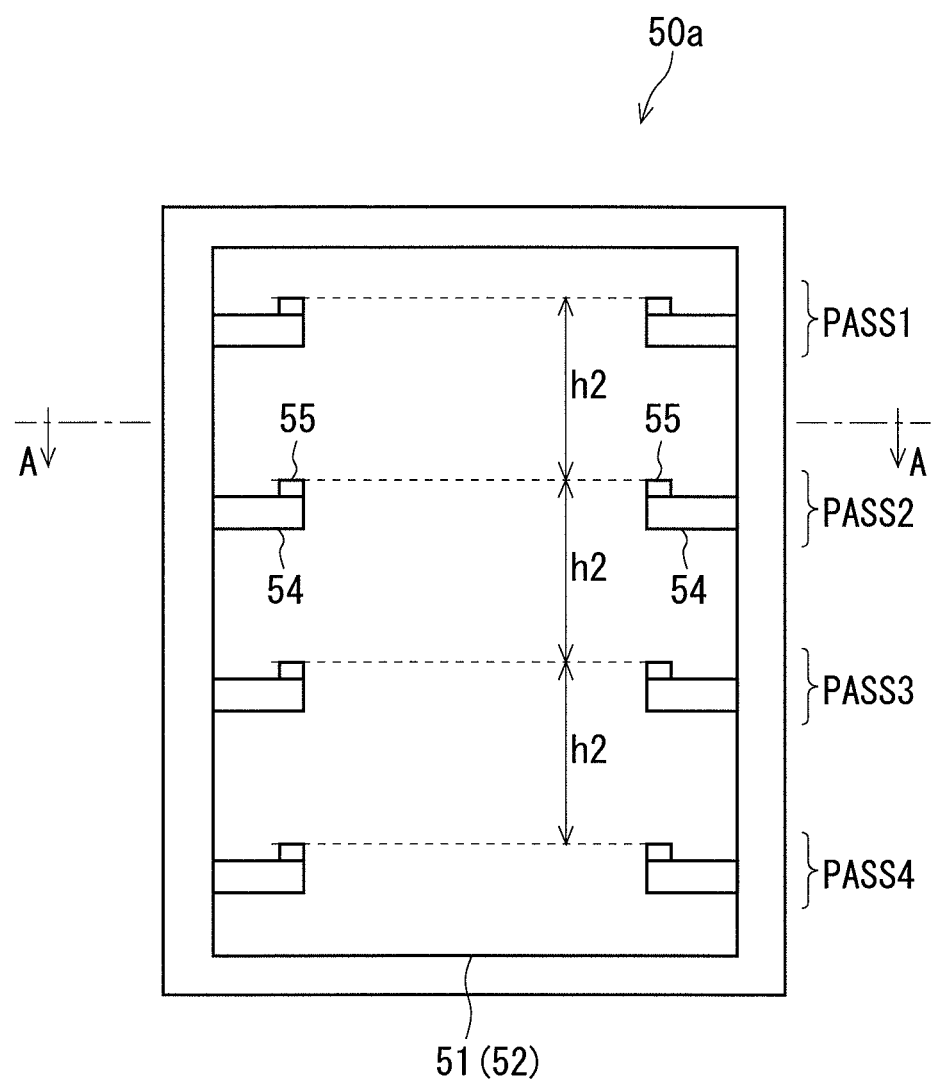
FIG. 8 is a side view of an intermediary section 50 common to all the embodiments.
Figure 9:
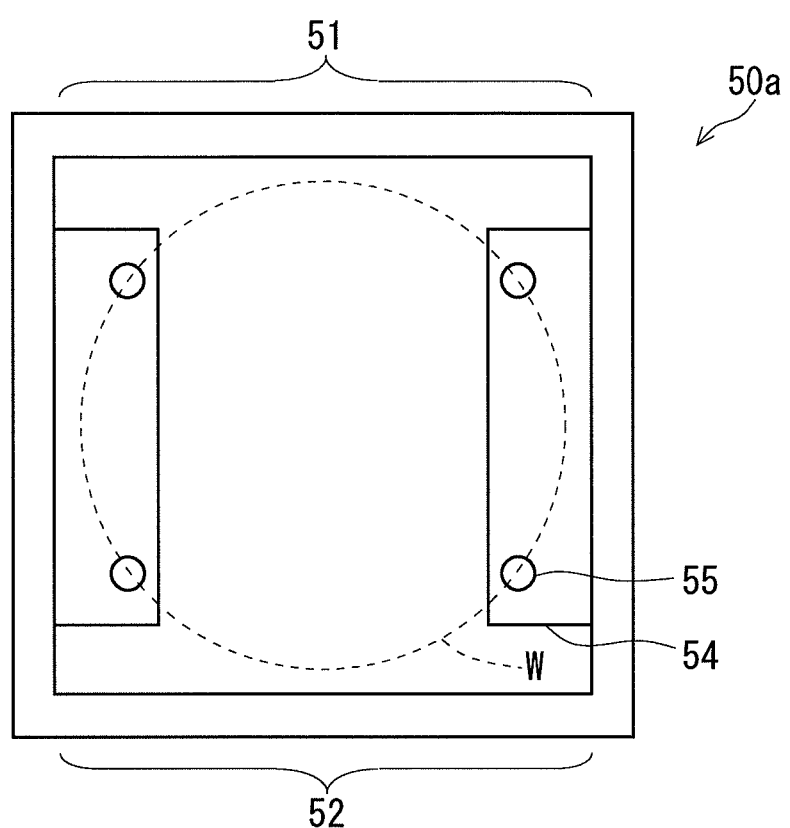
FIG. 9 is a top view of the intermediary section 50 common to all the embodiments.

FIG. 8 is a side view of the intermediary unit 50a of the first preferred embodiment. FIG. 9 is a top view taken along a section A-A of FIG. 8 in the direction of arrows. A side wall of the casing of the intermediary unit 50a facing the indexer robot IR is provided with an opening 51 for conveying-in and conveying-out of a substrate W. A different side wall facing the former side wall and close to the center robot CR is provided with an opening 52 for the same purpose.

The substrate placement parts PASS1 to PASS4 where the substrate W is supported in a substantially horizontal posture are provided in an area of the casing facing the openings 51 and 52. This allows the indexer robot IR and the center robot CR to access the substrate placement parts PASS1 to PASS4 through the openings 51 and 52 respectively. In the first preferred embodiment, the upper substrate placement parts PASS1 and PASS2 are used for transport of a processed substrate W from the processing zone 3 to the indexer zone 2. The lower substrate placement parts PASS3 and PASS4 are used for transport of an unprocessed substrate W from the indexer zone 2 to processing zone 3.

As shown in FIGS. 8 and 9, the substrate placement parts PASS1 to PASS4 are each composed of support members 54 in a pair fixed to side walls inside the casing, and four support pins 55 in two groups provided at opposite end portions of the upper surface of each support member 54. The support members 54 are fixed to the side walls in a pair different from the side walls where the openings 51 and 52 are formed. The support pins 55 are formed into conical shapes at their upper ends. Thus, the support pins 55 in two pairs support a substrate W at four places of the circumferential part of the substrate W such that the substrate W can be detached from the support pins 55.

The support pins 55 between the substrate placement parts PASS1 and PASS2, between PASS2 and PASS3, and between PASS3 and PASS4 are spaced by the same distance h2 in the vertical direction (see FIG. 8). The distance h2 is the same as the aforementioned distance h1 in the vertical direction between the hands 13b to 16b of the center robot CR. As a result, by making the advance-and-retreat driving mechanism 29 expand the hands 15b and 16b of the center robot CR simultaneously while the center robot CR faces the intermediary unit 50a, two unprocessed substrates W can be received simultaneously from the substrate placement parts PASS3 and PASS4 of the intermediary unit 50a. Likewise, by making the advance-and-retreat driving mechanism 29 expand the hands 13b and 14b of the center robot CR simultaneously, two processed substrates W held by the hands 13b and 14b can be transferred simultaneously to the substrate placement parts PASS1 and PASS2 of the intermediary unit 50a.

<1.4 Controller 60>

Figure 10:
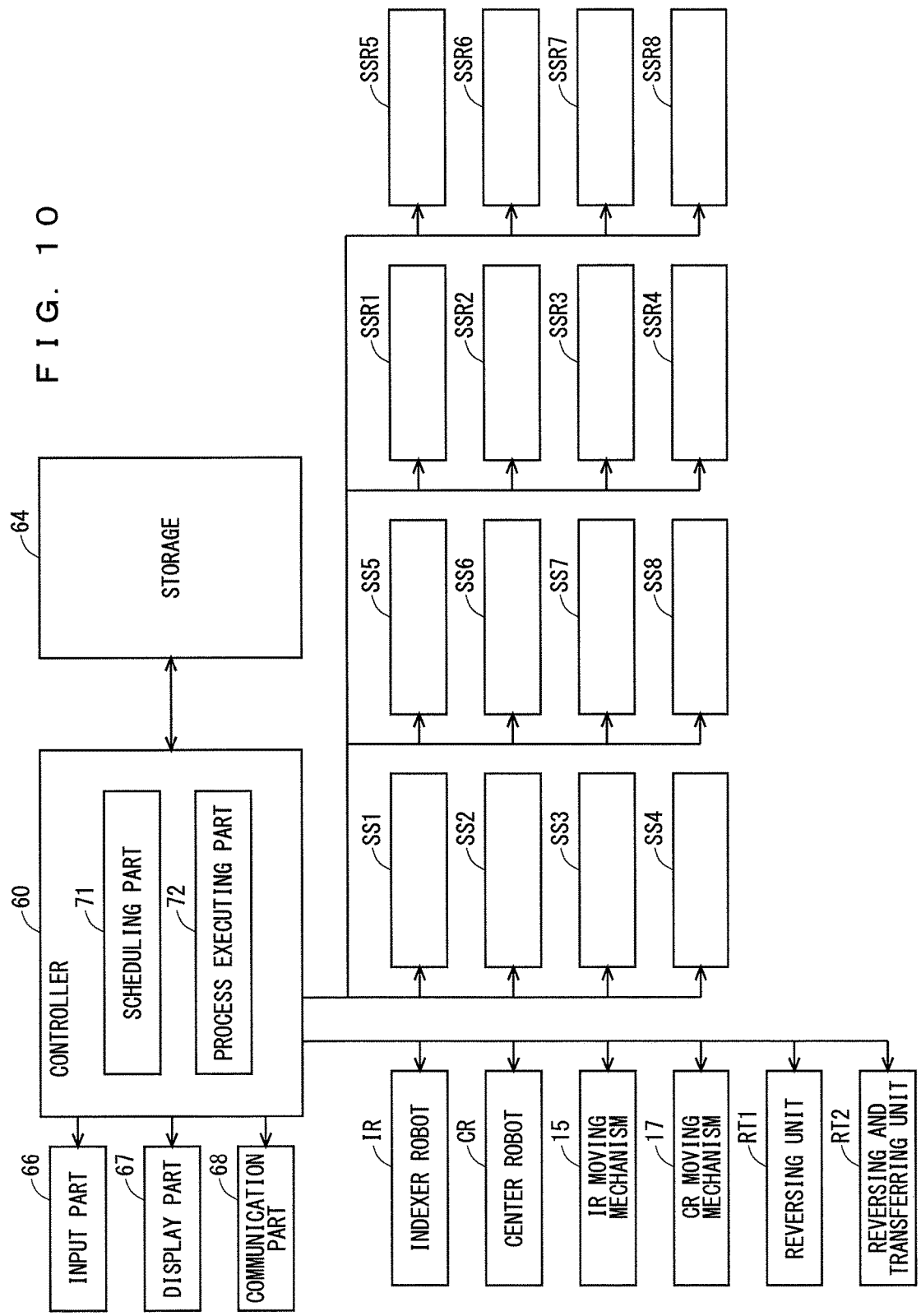
FIG. 10 is a systematic block diagram of the substrate processing apparatus 1 common to all the embodiments.
Figure 11:
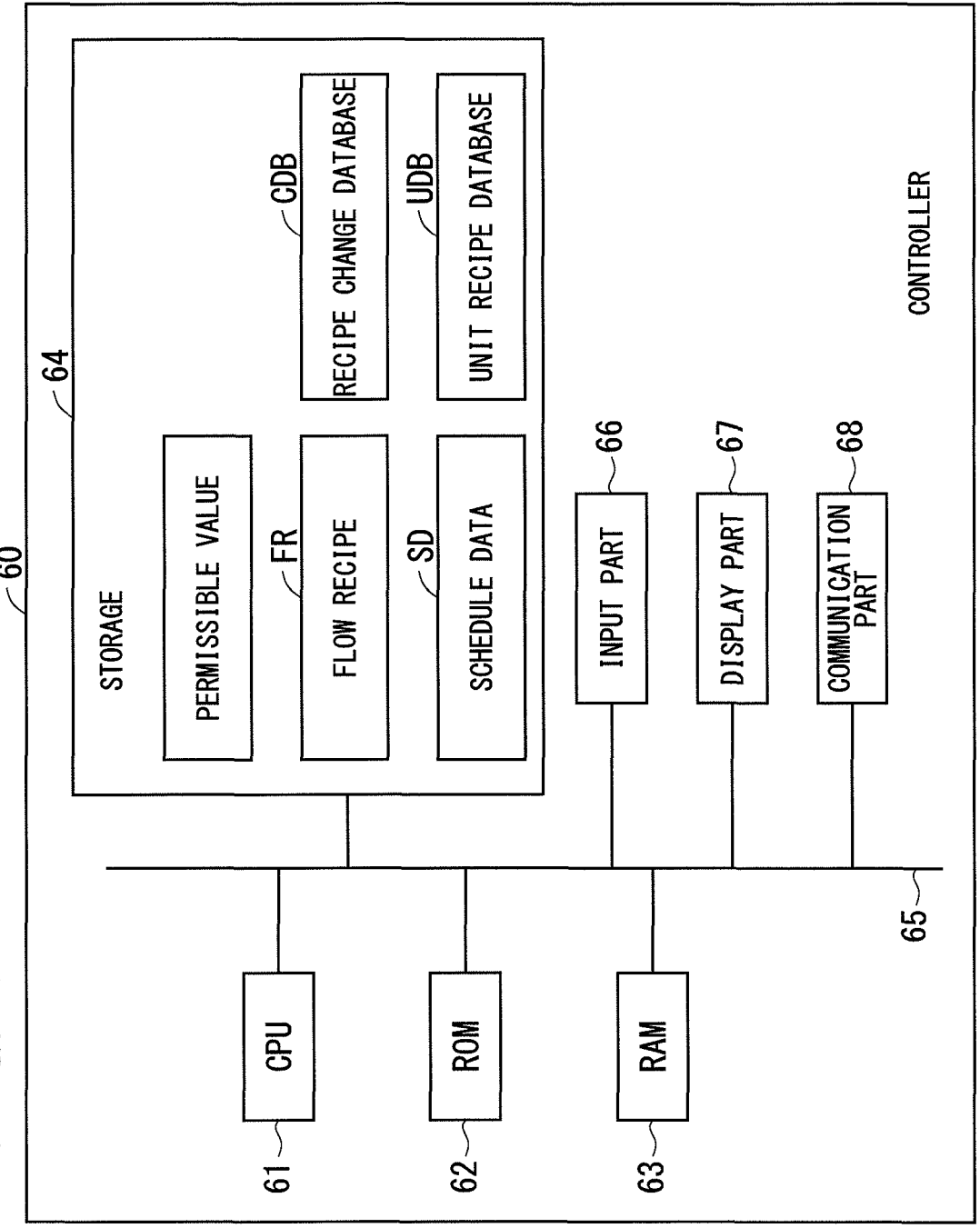
FIG. 11 is a block diagram showing the structure of a controller 60 common to all the embodiments.

FIG. 10 is a block diagram showing an electrical structure of the substrate processing apparatus 1. FIG. 11 is a block diagram showing an internal structure of the controller 60. As shown in FIG. 11, the controller 60 is formed of a general computer including for example a CPU 61, a ROM 62, a RAM 63, the storage 64 and the like connected to each other through a bus line 65. The ROM 62 stores a basic program and the like. The RAM 63 is provided as a working region for the CPU 61 to perform certain processing. The storage 64 is formed of a nonvolatile storage such as a flash memory or a hard disk drive. The storage 64 stores a recipe change database CDB, the flow recipe FR transmitted from the host computer to the controller 60, schedule data SD (described later) generated based on the flow recipe FR, and the unit recipe database UDB.

As shown in FIG. 10, the controller 60 functionally includes a scheduling part 71 and a process executing part 72. The controller 60 makes the CPU 61 execute a control program stored in advance for example in the ROM 62, thereby making the CPU 61 function as functional parts including the scheduling part 71 and the process executing part 72, while making a storage such as the RAM 63 and the storage 64 function as functional parts including a flow recipe FR storage, a schedule data SD storage, a unit recipe database UDB storage, and a permissible time storage.

The scheduling part 71 generates schedule data (hereinafter called "SD") about each target substrate W describing a time-series schedule in a table format based on the flow recipe FR, for example. The generated schedule data SD is stored in the storage 64.

The process executing part 72 puts various functions of the substrate processing apparatus 1 into operation according to the schedule data SD to execute transport of a target substrate W in the substrate processing apparatus 1 and cleaning process on the target substrate W in the processing unit SS (SSR).

The controller 60 further includes the input part 66, a display part 67, and a communication part 68 connected to the bus line 65. The input part 66 is formed of various switches and/or a touch panel, for example, and accepts instruction from an operator to enter various settings of a processing recipe, for example. The display part 67 is formed of a liquid crystal display or a lamp, for example, and displays information of various types under control by the CPU 61. The communication part 68 has a data communication function achieved through a LAN, for example. The controller 60 is connected to control targets including the indexer robot IR, the center robot CR, the IR moving mechanism 15, the CR moving mechanism 17, the front and rear surface cleaning processors 11 and 12, the reversing unit RT1, and the reversing and transferring unit RT2. Description of generation and change of the schedule data SD is given in detail after description of the behavior of the substrate processing apparatus 1.

2. Behavior of Substrate Processing Apparatus 1

The foregoing description relates to the structure of each device in the substrate processing apparatus 1 and the behavior in each device (including cleaning process and reversing process). The following description relates to transfer of a substrate W between each device in the substrate processing apparatus 1 (including substrate placement part PASS, reversing unit RT1, reversing and transferring unit RT2, and cleaning unit SS) and the indexer robot IR or the center robot CR, and substrate processing as viewed from the entire substrate processing apparatus 1.

<2.1 Transfer of Substrate W>

As described above, the indexer robot IR and the center robot CR each include a moving mechanism, a turning mechanism, an up-and-down mechanism, and an advance-and-retreat mechanism. Each of the indexer robot IR and the center robot CR is allowed to make each of its hands access each element inside the substrate processing apparatus 1.

Figure 14A:
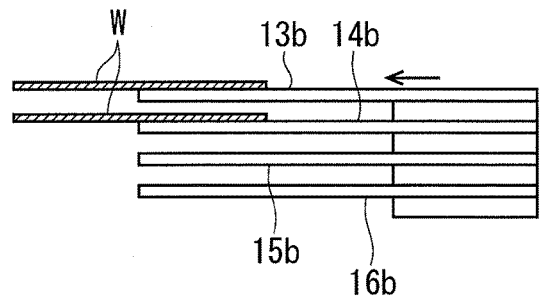
FIGS. 14A to 14C are conceptual views showing substrate transfer between the center robot CR and the intermediary section 50 common to all the embodiments.
Figure 14B:
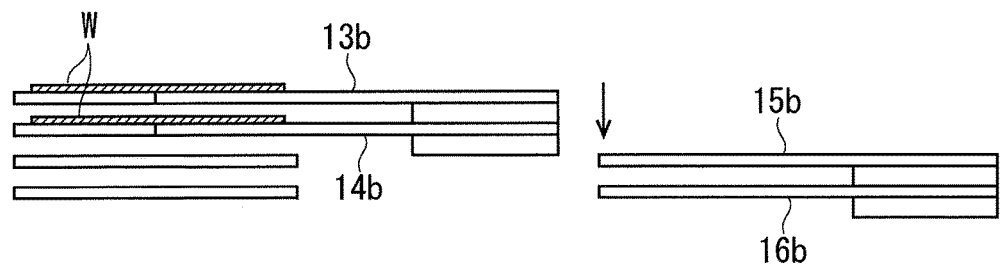
Figure 14C:
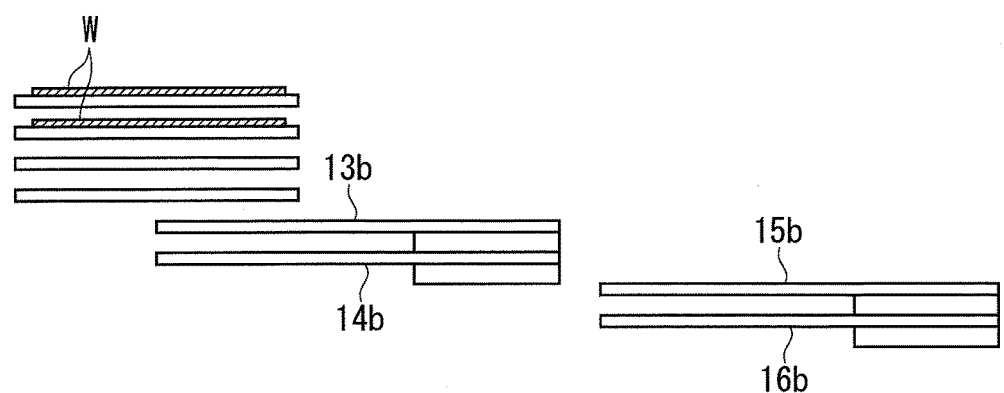

Transfer of a substrate mentioned herein is described below by giving an example of access from the center robot CR to the front surface cleaning unit SS and an example of access from the center robot CR to the intermediary section 50. FIGS. 12A to 12D and 13A to 13D are schematic views showing an example of transfer of a substrate between the center robot CR and the front surface cleaning unit SS. FIGS. 14A to 14C are schematic views showing transfer of a substrate between the center robot CR and the substrate placement part PASS. To facilitate understanding, only a substrate W, the support member 54 of each of the substrate placement parts PASS1 to PASS4, and the hands 13*b* to 16*b* are illustrated to show the transfer of a substrate in a simplified manner.

[Access to and from Center Robot CR and Processing Unit]

As shown in FIG. 12A, a processed substrate W1 is placed on the spin chuck 111 in the processing unit SS. The slit 116 of the processing unit SS makes sliding motion to open the gate 117. In order for the center robot CR to transport the processed substrate W1 from the front surface cleaning unit SS in this condition, the controller 60 first controls the turning mechanism 31 to make the hand 13*b* face the front surface cleaning unit SS. At the same time, the controller 60 controls the up-and-down driving mechanism 32 to place the upper surface of the hand 13*b* at a height below the upper surface of the spin chuck 111 and to place the lower surface of the hand 13*b* at a height above the upper surface of the rotation support 114 (see FIG. 12A).

Next, the controller 60 controls the advance-and-retreat driving mechanism 29 to expand the arm 13*a*. This makes the hand 13*b* move horizontally to go into the front surface cleaning unit SS. The member passage region at the tip of the hand 13*b* passes through the spin chuck 111 to place the hand 13*b* under the substrate W1 held on the spin chuck 111 as shown in FIG. 12B. The hands 13*b* to 16*b* of the first preferred embodiment can be expanded and contracted individually. Thus, only a hand required for conveying-in and conveying-out of a substrate (here, hand 13*b*) is allowed to go into the unit case 115 of the processing unit SS (SSR). This minimizes the quantity of particles that might be brought into the unit case 115 with the hands 13*b* to 16*b*. This can also reduce space between the spin chuck 111 and the rotation support 114 to a vertical width of an extent that allows entry of only one of the hands 13*b* to 16*b*.

Next, the controller 60 controls the up-and-down driving mechanism 32 to move up the hand 13*b*. As a result, the substrate W1 on the spin chuck 111 is transferred onto the hand 13*b* as shown in FIG. 12C. Then, the controller 60 controls the advance-and-retreat driving mechanism 29 to contract the arm 13*a*. This makes the hand 13*b* retreat from the front surface cleaning unit SS as shown in FIG. 12D. A series of these behaviors described above is to transport one substrate W from any front surface cleaning unit SS with the hand 13*b*. A substrate W can be transported with a different one of the hands 14*b* to 16*b* in the same way as in the aforementioned transport of one substrate W by making the up-and-down driving mechanism 32 change the height of a hand so as to satisfy the same condition as that of the aforementioned transport of one substrate W.

Conveying-in of a substrate is described next. The controller 60 controls the up-and-down driving mechanism 32 to move up the arm 15*a* to a height where an unprocessed substrate W2 held on the upper surface of the hand 15*b* is above the spin chuck 111 (FIG. 13A). Next, the controller 60 controls the advance-and-retreat driving mechanism 29 to expand the arm 15*a*. This makes the hand 15*b* move horizontally to go into the front surface cleaning unit SS. As shown in FIG. 13B, the unprocessed substrate W2 held over the hand 15*b* is placed above the spin chuck 111. Next, the controller 60 controls the up-and-down driving mechanism 32 to move down the hand 15*b*. As a result, the substrate W2 on the hand 15*b* is transferred onto the spin chuck 111 as shown in FIG. 13C. Then, the controller 60 controls the advance-and-retreat driving mechanism 29 to contract the arm 15*a*. This makes the hand 15*b* retreat from the front surface cleaning unit SS as shown in FIG. 13D.

A series of these behaviors described above is to transport one substrate W to the front surface cleaning unit SS with the hand 15*b*. One substrate W can be transported to the rear surface cleaning unit SSR in the same way as in the aforementioned transport of one substrate W to the front surface cleaning unit SS.

As shown in FIGS. 13B and 13C, there is a time when the hand 15*b* overlaps the spin chuck 111 in a side view (as viewed in the horizontal direction). At this time, as a result of the aforementioned shape of the hand 15*b* like a bifurcated fork, the spin chuck 111 goes inside the hand 15*b* so that it does not interfere with the hand 15*b*. Likewise, there is a time when a support pin of the substrate placement part PASS or the reversing unit RT and each hand overlap each other in a side view (as viewed in the horizontal direction) during transfer of a substrate between the support pin and each hand. The pin and the hand mentioned herein are also designed to avoid interference with each other.

[Access from Center Robot CR to Intermediary Section 50]

FIGS. 14A to 14C are schematic views showing an example of how the center robot CR transports two substrates W simultaneously to the substrate placement parts PASS1 and PASS2. For simultaneous transport of two substrates W to the substrate placement parts PASS1 and PASS2, the center robot CR transports the two substrates W to the substrate placement parts PASS1 and PASS2 simultaneously while making each of the hands 13b and 14b hold one substrate W (conveying-in of two substrates).

More specifically, the controller 60 controls the turning mechanism 31 and the up-and-down driving mechanism 32 to make the hands 13b and 14b face the substrate placement parts PASS1 and PASS2 respectively. At this time, as shown in FIG. 14A, the hands 13b and 14b have moved up or down to respective heights where the two substrates W held on the hands 13b and 14b are placed above the substrate placement parts PASS1 and PASS2 respectively.

As described above, the gap in the vertical direction between an upper position and a lower position where substrates are held by corresponding ones of the substrate placement parts PASS1 to PASS4 placed one above the other is set to be the same as the gap in the vertical direction between the two substrates W held on the hands 13b and 14b of the center robot CR. Thus, arrangement made by the up-and-down driving mechanism 32 to place the substrate W held on the hand 13b above the substrate placement part PASS1 allows the substrate W held on the different hand 14b to be placed above the substrate placement part PASS2.

Next, the controller 60 controls the advance-and-retreat driving mechanism 29 to expand the arms 13a and 14a simultaneously. This makes the hands 13b and 14b go into the substrate placement parts PASS1 and PASS2 respectively. As a result, as shown in FIG. 14B, the two substrates W held on the hands 13b and 14b are placed above the substrate placement parts PASS1 and PASS2 respectively.

Then, the controller 60 controls the up-and-down driving mechanism 32 to move down the hands 13b and 14b until the two substrates W are supported on the substrate placement parts PASS1 and PASS2. As shown in FIG. 14C, this places the substrates W simultaneously on the support pins 55 of the substrate placement parts PASS1 and PASS2 not shown in FIG. 14C, thereby transferring the two substrates W simultaneously from the center robot CR to the substrate placement parts PASS1 and PASS2. Then, the controller 60 controls the advance-and-retreat driving mechanism 29 to contract the arms 13a and 14a simultaneously, so that the hands 13b and 14b retreat from the substrate placement parts PASS1 and PASS2 respectively (conveying-in of two substrates).

Although not shown in the drawings, for simultaneous transport of two unprocessed substrates W from the substrate placement parts PASS3 and PASS4, the center robot CR makes a series of the aforementioned behaviors in the opposite way. Specifically, the hands 15b and 16b are expanded to extend below the substrate placement parts PASS3 and PASS4 respectively. Next, the hands 15b and 16b are moved up and then the arms 15a and 16a are contracted simultaneously. As a result, two substrates W can be transported simultaneously from the substrate placement parts PASS3 and PASS4 with the hands 15b and 16b respectively (conveying-out of two substrates).

The foregoing description relates to conveying-in of two substrates W and conveying-out of two substrates W between the center robot CR and the substrate placement part PASS. A series of these behaviors is applicable to transfer of substrates between the center robot CR and a different unit. More specifically, the aforementioned conveying-in of two substrates and the aforementioned conveying-out of two substrates are applicable to transfer of substrates between the center robot CR and the reversing unit RT1, between the indexer robot IR or the center robot CR and the reversing and transferring unit RT2, between the indexer robot IR and the substrate placement part PASS, and between the indexer robot IR and the carrier C.

A hand of each robot (CR or IR) of the first preferred embodiment to be used is determined whether a substrate W to be held on this hand is an unprocessed substrate before subjected to cleaning process or a processed substrate after subjected to the cleaning process. Thus, according to the principle of the aforementioned conveying-in and conveying-out, the hands 7b, 7c, 15b, and 16b prepared for an unprocessed substrate can be used for conveying-in and conveying-out of a processed substrate W. However, such use of the hand is not intended in the first preferred embodiment. This also applies to the hands 6b, 6c, 13b, and 14b prepared for a processed substrate.

If the center robot CR holds multiple substrates W, the center robot CR may transport these substrates W one by one to multiple cleaning units SS (or SSR). Likewise, the center robot CR may transport substrates W one by one from multiple cleaning units SS (or SSR). In either case, in terms of only a relationship between the individual cleaning unit SS (or SSR) and the center robot CR, the center robot CR transports one substrate to and from this cleaning unit SS (SSR). However, in terms of a relationship between the cleaning processor 11 (or 12) as an aggregate of the multiple cleaning units SS (or SSR) and the center robot CR, the center robot CR can be considered to transport two substrates to and from the cleaning processor 11 (or 12). Thus, in this specification, like transport of two substrates to (or from) the intermediary section 50 by the center robot CR by making access to the intermediary section 50, sequential transport of multiple substrates W to multiple cleaning units SS (or SSR) by the center robot CR holding these substrates W or sequential transport of multiple substrates W from multiple cleaning units SS (or SSR) and movement of these substrates W to a different segment by the center robot CR is described as conveying (or conveying-out) transport of two substrates by the center robot CR.

<2.2 Pattern of Substrate Processing>

The following describes patterns of substrate processing that can be adopted by the substrate processing apparatus 1.

The substrate processing apparatus 1 can perform various substrate processing patterns selectively on a substrate W including "cleaning of only front surface," "cleaning of only rear surface," "cleaning of both surfaces (rear surface first and then front surface)," and "cleaning of both surfaces (front surface first and then rear surface)," for example. According to the pattern "cleaning of only front surface," after a substrate W is transported from the carrier C, the front surface of the substrate W is subjected to cleaning process without being turned over. After the cleaning process, the substrate W is returned to the carrier C without being turned over. According to the pattern "cleaning of only rear surface," after a substrate W is transported from the carrier C, the substrate W is turned over. Then, the rear surface of the substrate W is subjected to cleaning process. After the cleaning process, the substrate W is turned over and is then returned to the carrier C. According to the pattern "cleaning of both surfaces (rear surface first and then front surface)," after a substrate W is transported from the carrier C, the substrate W is turned over. Then, the rear surface of the substrate W is subjected to cleaning process. Next, the substrate W is turned over to point the front surface of the substrate W upward. Then, the front surface of the substrate W is subjected to cleaning process. The substrate W is thereafter returned to the carrier C without being turned over. According to the pattern "cleaning of both surfaces (front surface first and then rear surface)," after a substrate W is transported from the carrier C, the front surface of the substrate W is subjected to cleaning process without being turned over. Next, the substrate W is turned over to point the rear surface of the substrate W upward. Then, the rear surface of the substrate W is subjected to cleaning process. The substrate W is thereafter turned over and is then returned to the carrier C.

FIG. 15 is a table including multiple processing segments S1 to S13 arranged according to a flow of the aforementioned processes that are formed by dividing a processing zone responsible for a series of these processes.

The processing segment S1 is a segment where an unprocessed substrate W is held. The processing segment S2 is a segment where the unprocessed substrate W is transported. The processing segment S3 is a segment where the unprocessed substrate W is transferred from the indexer zone 2 to the processing zone 3. The processing segment S4 is a segment where the unprocessed substrate W is transported to the cleaning unit SS (SSR) to perform first substrate processing. The processing segment S5 is a segment where the substrate W is subjected to the first substrate processing. The processing segment S6 is a segment where the substrate W after subjected to the first substrate processing is transported from the cleaning unit SS (SSR) to the intermediary section 50. The processing segment S7 is a segment where the substrate W after subjected to the first substrate processing is reversed. The processing segment S8 is a segment where the substrate W after subjected to the first reversal is transported from the intermediary section 50 to the cleaning unit SS (SSR) for second substrate processing. The processing segment S9 is a segment where the substrate W is subjected to the second substrate processing. The processing segment S10 is a segment where the substrate W after subjected to the second substrate processing is transported from the cleaning unit SS (SSR). The processing segment S11 is a segment where the substrate W is transferred from the processing zone 3 to the indexer zone 2. The processing segment S12 is a segment where the processed substrate W is transported. The processing segment S13 is a segment where the processed substrate W is held.

As shown in the table of FIG. 15, according to a first pattern, a substrate W is held by the carrier C in the processing segment S1, transported by the indexer robot IR in the processing segment S2, held by the substrate placement part PASS in the processing segment S3, transported by the center robot CR in the processing segment S4, subjected to process of cleaning the front surface thereof by the front surface cleaning unit SS in the processing segment S5, transported by the center robot CR in the processing segment S6, held by the substrate placement part PASS in the processing segment S11, transported by the indexer robot IR in the processing segment S12, and held by the carrier C in the processing segment S13.

According to a second pattern, a substrate W is held by the carrier C in the processing segment S1, transported by the indexer robot IR in the processing segment S2, reversed by the reversing and transferring unit RT2 in the processing segment S3, transported by the center robot CR in the processing segment S4, subjected to process of cleaning the rear surface thereof by the rear surface cleaning unit SSR in the processing segment S5, transported by the center robot CR in the processing segment S6, reversed by the reversing and transferring unit RT2 in the processing segment S11, transported by the indexer robot IR in the processing segment S12, and held by the carrier C in the processing segment S13.

According to a third pattern, a substrate W is held by the carrier C in the processing segment S1, transported by the indexer robot IR in the processing segment S2, reversed by the reversing and transferring unit RT2 in the processing segment S3, transported by the center robot CR in the processing segment S4, subjected to process of cleaning the rear surface thereof by the rear surface cleaning unit SSR in the processing segment S5, transported by the center robot CR in the processing segment S6, reversed by the reversing unit RT1 in the processing segment S7, transported by the center robot CR in the processing segment S8, subjected to cleaning of the front surface thereof by the front surface cleaning unit SS in the processing segment S9, transported by the center robot CR in the processing segment S10, held by the substrate placement part PASS in the processing segment S11, transported by the indexer robot IR in the processing segment S12, and held by the carrier C in the processing segment S13.

According to a fourth pattern, a substrate W is held by the carrier C in the processing segment S1, transported by the indexer robot IR in the processing segment S2, held by the substrate placement part PASS in the processing segment S3, transported by the center robot CR in the processing segment S4, subjected to cleaning of the front surface thereof by the front surface cleaning unit SS in the processing segment S5, transported by the center robot CR in the processing segment S6, reversed by the reversing unit RT1 in the processing segment S7, transported by the center robot CR in the processing segment S8, subjected to process of cleaning the rear surface thereof by the rear surface cleaning unit SSR in the processing segment S9, transported by the center robot CR in the processing segment S10, reversed by the reversing and transferring unit RT2 in the processing segment S11, transported by the indexer robot IR in the processing segment S12, and held by the carrier C in the processing segment S13.

3. Flow Recipe

A data structure of the flow recipe FR is described next by referring to FIGS. 16 and 17. FIGS. 16 and 17 are tables showing respective data structures of examples (flow recipe FR1 and flow recipe FR2) of the flow recipe FR. As shown in FIGS. 16 and 17, the flow recipe FR contains data items including a first item "STEP," a second item "PROCESSING UNIT," and a third item "UNIT RECIPE."

As described above, an unprocessed substrate W passes through the substrate placement part PASS of the intermediary unit 50a or the like and is then transported to the processing unit SS (SSR) by the center robot CR. The flow recipe FR includes "PROCESSING UNIT" in the row "Step 1" that is a data item defining the cleaning unit SS (SSR) to which a substrate W placed for example on the substrate placement part PASS is to be transported first. In each of the examples of the flow recipe FR1 (FIG. 16) and the flow recipe FR (FIG. 17), the item "PROCESSING UNIT" includes SS1 to SS4. This means that a substrate W is to be transported first to any of the front surface cleaning units SS1 to SS4.

Substrates W are prepared in advance in units of lots and placed for example on the substrate placement part PASS by the indexer robot IR. The center robot CR transports these substrates W in turn for example from the substrate placement part PASS and transports these substrates W to the front surface cleaning units SS1 to SS4 assigned to the corresponding substrates W according to instruction by the process executing part 72 (see FIG. 10).

The substrate processing apparatus 1 can clean both surfaces of a substrate W. To clean both surfaces of a substrate W, the substrate W goes across multiple cleaning units SS (SSR) where the substrate W is to be processed (see the third and fourth patterns of FIG. 15). Like in this case, if a target substrate W is to be transported between multiple cleaning units SS (SSR), a destination of transport of the substrate W should be added. In this case, data is added to the flow recipe FR in rows of STEP of a number corresponding to the number of additional destinations of transport.

As an example, if the flow recipe FR1 follows the "fourth pattern (cleaning of both surfaces (front surface first and then rear surface))," the row of "Step 2" is added below the row "Step 1." This additional row identifies the rear surface cleaning unit SSR to which a substrate W after subjected to cleaning of its front surface is to be transported.

The field "UNIT RECIPE" is a data item defining process to be performed by the cleaning unit SS (SSR) by assigning a recipe number. As described above, the cleaning unit SS (SSR) can perform substrate processing. The field of substrate processing in the flow recipe FR identifies the substance of substrate processing to be performed on a target substrate W by assigning a recipe number. A recipe number "UNIT RECIPE 1" is assigned to the field of substrate processing in the flow recipe FR1, whereas a recipe number "UNIT RECIPE 2" is assigned to the field of substrate processing in the flow recipe FR2.

Selection of the cleaning unit SS (SSR) is described next.

As described above, the substrate processing apparatus 1 can perform substrate processing in parallel identified by each STEP in a flow recipe in the multiple processing units SS (SSR). As an example, Step 1 in the item STEP in the flow recipe FR1 of FIG. 16 can be executed by any of the cleaning units SS1 to SS4. In this case, the cleaning units SS1 to SS4 perform substrate processing in parallel corresponding to "UNIT RECIPE 1."

The scheduling part 71 (see FIG. 10) generally extracts all cleaning units SS (SSR) from cleaning units SS (SSR) available at the time of start of a job, and makes a substrate processing schedule such that all the extracted cleaning units SS (SSR) perform substrate processing in parallel.

Figure 18:
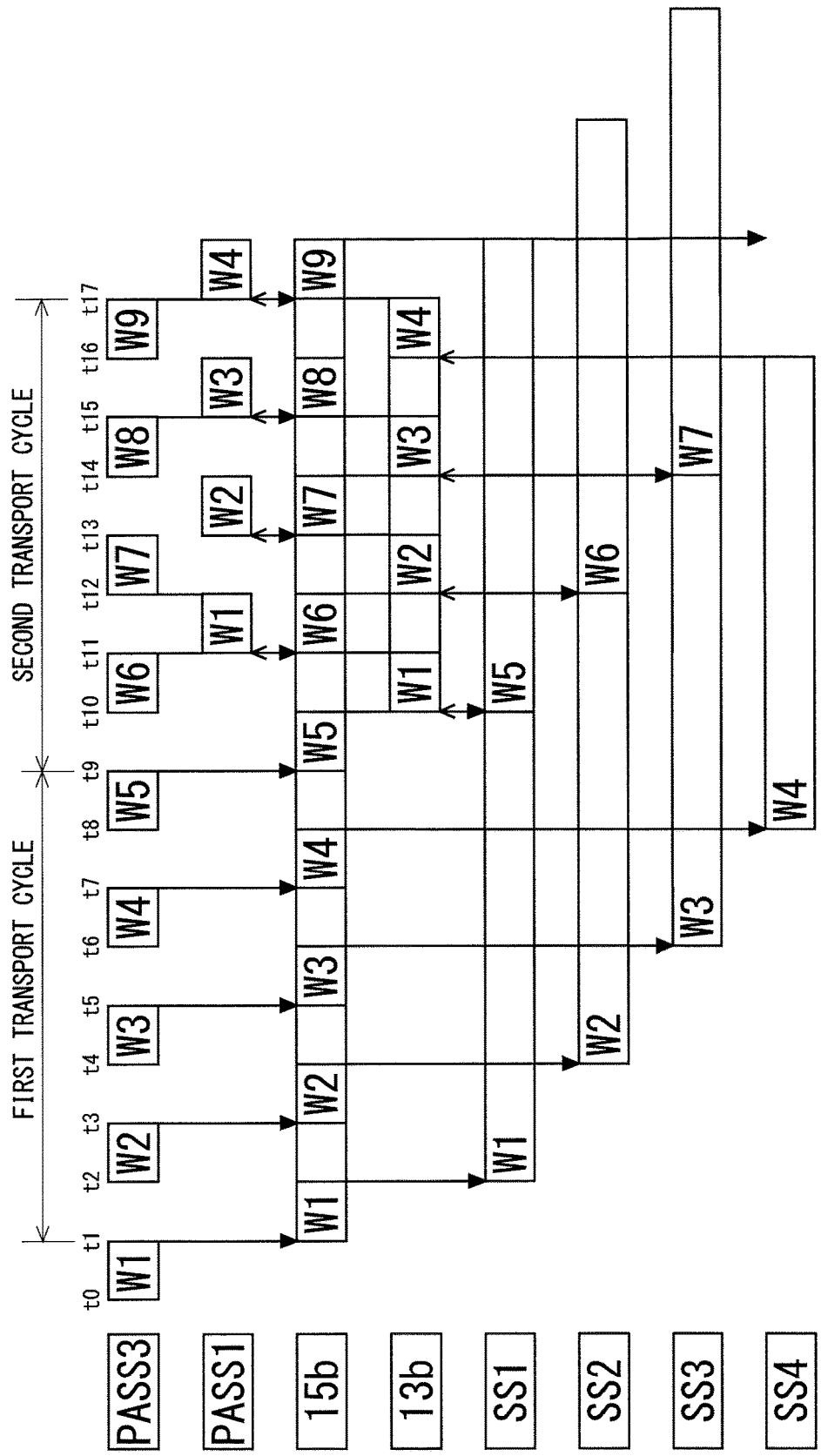
FIGS. 18 and 19 are timing diagrams showing exemplary substrate processing schedules according to a first preferred embodiment.

FIG. 18 shows an example of a schedule made in this way.

FIG. 18 is a timing diagram relating to transport of substrates W between the substrate placement parts PASS1 and PASS3 and the four cleaning units SS1 to SS4 with the hands 13b and 15b of the center robot CR.

The center robot CR (hand 15b) transports the substrates W one by one in a given order toward the four front surface cleaning units SS1 to SS4. Specifically, the center robot CR (hand 15b) transports the substrates W in the following order: front surface cleaning units SS1, SS2, SS3, and SS4.

More specifically, an unprocessed substrate W1 is placed on the substrate placement part PASS3 at time t0. At time t1, the hand 15b of the center robot CR takes the substrate W1 out of the substrate placement part PASS3 and moves to a position facing the cleaning unit SS1 in a period from time t1 to time t2. At time t3, the hand 15b transports the substrate W1 to the front surface cleaning unit SS1.

Next, in a period from time t2 to time t3, the center robot CR moves to a position where the hand 15b faces the substrate placement part PASS3. At time t3, the hand 15b takes a second unprocessed substrate W2 out of the substrate placement part PASS3 and transports the second substrate W2 to the second front surface cleaning unit SS2 at time t4.

In this way, four substrates including W1 to W4 (called a group of substrates W1 to W4) are transported in order toward the four front surface cleaning units SS1 to SS4 used for parallel processing, and are then subjected to substrate processing in parallel. A period from the time (time t1, for example) when the center robot CR starts to transport a first substrate (substrate W1, for example) in a preceding group to the time (time t9, for example) when the center robot CR starts to transport a first substrate (substrate W5, for example) in a subsequent group is called a transport cycle.

Simultaneously with completion of a first transport cycle (from time t1 to time t9), the center robot CR starts a transport cycle (second transport cycle) for a second group of substrates W5 to S8 (time t9). In the second transport cycle (from time t9 to time t17), unlike in the first transport cycle (from time t1 to time t9), a processed substrate W is transported from the front surface cleaning unit SS to the center robot CR almost simultaneously with transport of an unprocessed substrate W from the center robot CR to the cleaning unit SS (time t10, time t12, time t14, and time t16) (see FIGS. 12A to 12D). Further, an unprocessed substrate W is transported from the substrate placement part PASS to the center robot CR almost simultaneously with transport of a processed substrate W from the center robot CR to the substrate placement part PASS (time t11, time t13, and time t15) (see FIGS. 14A to 14C).

A third transport cycle is started simultaneously with completion of the second transport cycle (time t17). The center robot CR repeats the behavior in the second transport cycle, thereby transporting four substrates W in one group one by one toward all the cleaning units SS1 to SS4 to perform parallel processing and collecting four substrates W in one group one by one from all the cleaning units SS1 to SS4.

In the example of FIG. 18, a time (from time t1 to time t9) required for one cycle of substrate transport is completely the same as a time (necessary staying time; from time t2 to time t10) necessary for one substrate W to stay in any of the cleaning units SS1 to SS4. Thus, a transport cycle and substrate processing by each of the cleaning units SS1 to SS4 proceed in perfect synchronization. As a result, a standby time is not generated on the side of all of the center robot CR and the cleaning units SS1 to SS4. The necessary staying time is a time from when transport of a substrate W to the cleaning unit SS (SSR) is started to when the substrate W becomes transportable from this unit SS (SSR). The necessary staying time is substantially the same as a time determined by adding a time required for conveying-in and a time required for conveying-out to a time when a substrate W is being subjected to substrate processing by one cleaning unit SS (SSR). Thus, the necessary staying time can be determined by referring to the aforementioned flow recipe FR1.

In some cases, a time required for one cycle of substrate transport may not be the same as the necessary staying time in each cleaning unit SS (SSR).

A time required for one cycle of substrate transport longer than the necessary staying time produces a transport rate limiting condition. This condition generates a time when a substrate W after subjected to substrate processing waits for transport from the cleaning unit SS (SSR).

The necessary staying time longer than a time required for one cycle of substrate transport produces a process rate limiting condition. This condition generates a time when the center robot CR should wait until the center robot CR can actually start transport of a substrate to or from the cleaning unit SS (SSR) after the center robot CR becomes accessible to this cleaning unit SS (SSR).

A larger number of times processing that are performed in parallel increases the throughput of the substrate processing apparatus 1 further. Thus, a substrate transport schedule is generally made so as to achieve the transport rate limiting condition by maximizing the number of units for parallel processing. However, this might make it impossible to transport a substrate W from the cleaning unit SS (SSR) even after substrate processing on this substrate W is finished.

As described above by referring to FIG. 5, in each cleaning unit SS (SSR), a substrate W is subjected to cleaning process, rinsing process, and drying process in order. It is desirable that a substrate W after subjected to drying process be transported from the cleaning unit SS (SSR) as soon as possible. This is for the reason as follows. Mist for example of a cleaning liquid floating inside the cleaning unit SS (SSR) may adhere to the front surface (rear surface) of a substrate W after subjected to drying process, causing the fear of re-contamination of the front surface (rear surface) of the substrate W.

Figure 19:
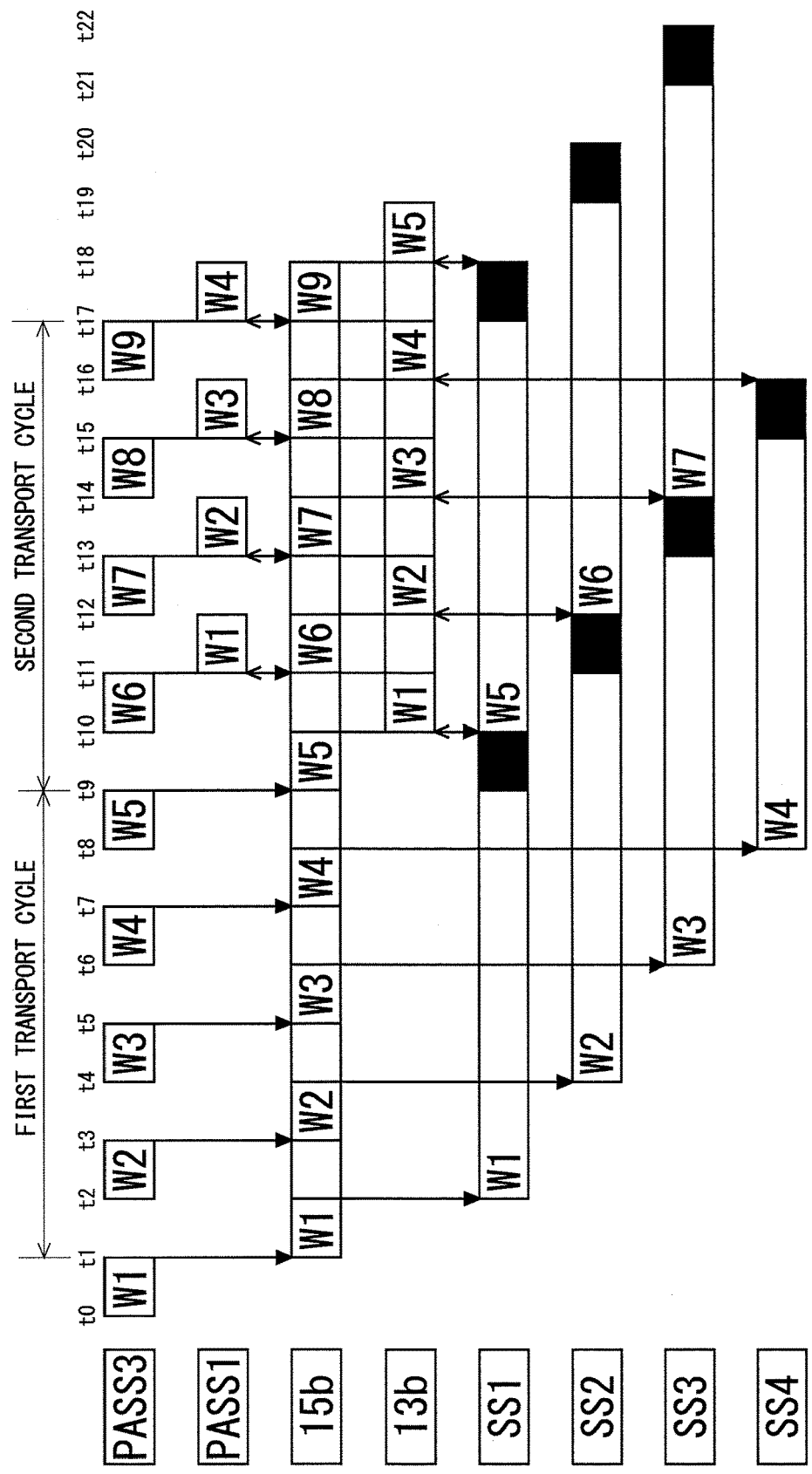

FIG. 19 is a timing diagram relating to the transport rate limiting condition. A time required for one cycle of substrate transport (a period from time t1 to time t9) is longer than the necessary staying time (period from time t2 to time t9). This generates an conveying-out standby time (from time t9 to time t10, from time t11 to time t12, from time t13 to time t14, and from time t15 to time t16, for example) in each of the cleaning units SS1 to SS4. (In the timing diagram of FIG. 19 and those in other drawings, a time zone relating to the cleaning unit SS where the conveying-out standby time is generated is colored.) If these conveying-out standby times become longer than necessary, mist of a cleaning liquid or the like may adhere to a substrate W again after the substrate W is subjected to drying process, causing the fear of degradation of cleaning quality of the substrate W. Meanwhile, generation of the conveying-out standby time does not immediately cause degradation of cleaning quality of a substrate W, as an extremely short conveying-out standby time generates only mist at a permissible level to adhere to a substrate. Thus, a given permissible time can be allowed for as the conveying-out standby time. The time permissible as the conveying-out standby time can be set based on the amount of mist inside the cleaning unit SS (SSR), a requested cleaning quality of a substrate, or designation by an operator.

4. Substrate Processing

Figure 20:
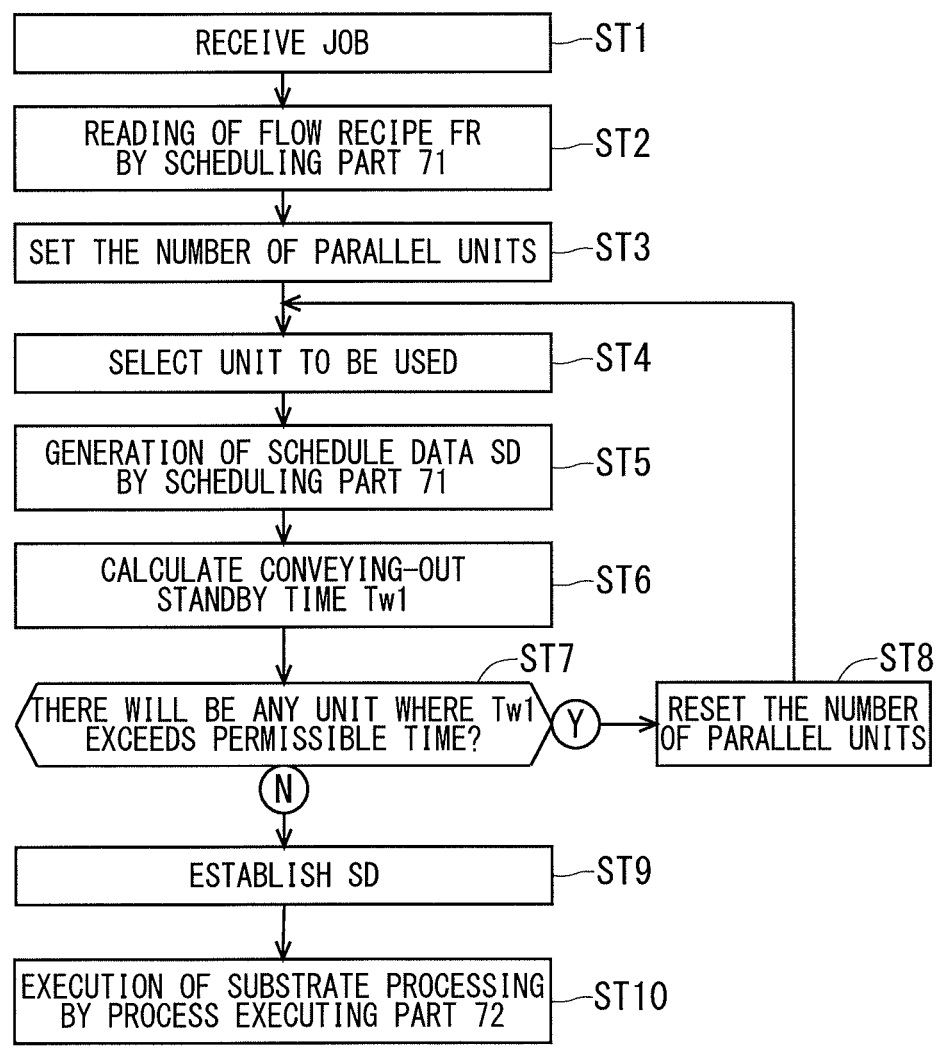
FIG. 20 is a flowchart showing a flow of substrate processing according to the first preferred embodiment.

A flow of substrate processing in the first preferred embodiment is described next by referring to the flowchart of FIG. 20. First, a job is given from the host computer not shown in the drawings to the controller 60 (step ST1).

The scheduling part 71 reads the flow recipe FR identified by the job from the storage 64 (step ST2). The scheduling part 71 sets the number of the cleaning units SS (SSR) to behave in parallel (hereinafter called the number of parallel units) by referring to the flow recipe FR (step ST3). The number of parallel units is set so as to produce the transport rate limiting condition. The transport rate limiting condition appears if a time required for one cycle of substrate transport exceeds the necessary staying time in the cleaning units SS (SSR). The time required for one cycle of substrate transport can be calculated based on the number of parallel units and the necessary staying time. As described above, the necessary staying time can be obtained by referring to a unit recipe number described in the flow recipe FR. Thus, the scheduling part 71 can set the number of parallel units by referring to the flow recipe FR.

Next, the scheduling part 71 selects the cleaning units SS (SSR) (step ST4) to be used actually from the cleaning units SS (SSR) available at the time of setting a schedule within a range that does not exceed the number of parallel units set in step ST2.

The scheduling part 71 generates the schedule data SD (step ST5) based on the flow recipe FR read in step ST2, the substance of a particular unit recipe identified with a recipe number in the flow recipe FR (as described above, this unit recipe is stored in the unit recipe database UDB in the storage 64), and the cleaning units SS (SSR) selected in step ST4. The schedule data SD describes the behavior of the substrate processing apparatus 1 in a time-series manner. The schedule data SD generated here is data such as that shown in FIG. 19.

The scheduling part 71 calculates an conveying-out standby time in the cleaning units SS (SSR) (step ST6) to be used for parallel processing by referring to the schedule data SD generated in step ST5. Next, it is determined whether there will be no cleaning unit SS (SSR) in which a conveying-out standby time exceeds a permissible time (step ST7). The value of the permissible time is stored in advance in the storage 64 as a value unique to the substrate processing apparatus 1 (see FIG. 11). The value of the permissible time depends on the substance of substrate processing, so that it may be descried in the flow recipe FR. As an example, a relatively short permissible time can be set for substrate processing to cause a large quantity of mist of a cleaning liquid or substrate processing required to achieve cleaning performance of a particularly high quality. Conversely, a relatively long permissible time can be set for substrate processing to cause only a small quantity of mist of a cleaning liquid or substrate processing not required to achieve high-level cleaning performance. The permissible time may be common to the cleaning units SS (SSR) or alternatively, may differ between the cleaning units SS (SSR). As an example, the rear surface cleaning unit SSR generally causes mist of a larger quantity than the front surface cleaning unit SS, so that the permissible time may be set relatively shorter for the rear surface cleaning unit SSR than for the front surface cleaning unit SS.

If a result of the determination in step ST7 is "Yes," step ST8 is executed to reset the number of parallel units. In this step, the number of parallel units is reduced by one. This shortens the conveying-out standby time. Then, the aforementioned processes in steps ST4 to ST7 are repeated.

Figure 21:
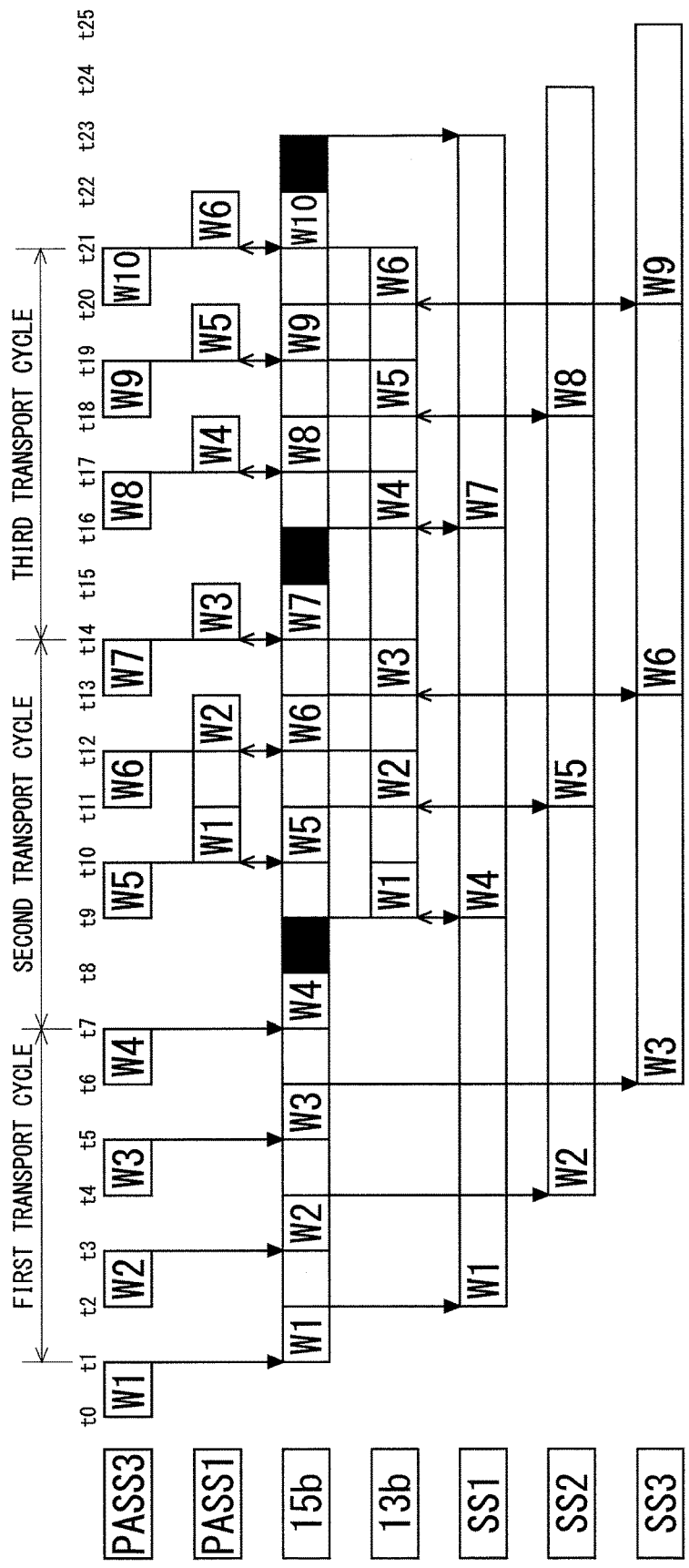
FIG. 21 is a timing diagram showing an exemplary schedule according to the first preferred embodiment.

FIG. 21 is a timing diagram determined by reducing the number of parallel units in the substrate processing schedule shown in FIG. 19 from "4" to "3." Reducing the number of parallel units makes a transition from the transport rate limiting condition to the process rate limiting condition, so that the conveying-out standby time in each of the cleaning units SS1 to SS3 becomes zero. Meanwhile, a standby time is generated when the center robot CR should wait until the center robot CR actually starts transport of a substrate to or from the cleaning unit SS after the center robot CR becomes accessible to this cleaning unit SS (from time t8 to time t9 and from time t15 to time t16).

Then, a result of the determination in step ST7 becomes "No" and step ST9 is executed next.

In the example descried by using FIGS. 19 and 21, the transition from the transport rate limiting condition to the process rate limiting condition is made by reducing the number of parallel units. Meanwhile, even in the transport rate limiting condition, a result of the determination in step ST7 can still be "No". Thus, even in the transport rate limiting condition, a substrate processing schedule can still be made such that a conveying-out standby time does not exceed a permissible time.

In step ST9, the schedule data SD is established and stored in the storage 64 (see FIG. 11).

Based on the established schedule data SD, the process executing part 72 actuates each element of the substrate processing apparatus 1 to perform substrate processing on multiple substrates W sequentially (step ST10).

In the first preferred embodiment, the schedule data SD is not updated after substrate processing is started. Alternatively, like in a second preferred embodiment described below, the schedule data SD can be updated as occasion arises in parallel with execution of substrate processing. The second preferred embodiment features feedback control of reconsidering the number of parallel units that is timed to occur at the start of a new transport cycle.

Second Preferred Embodiment

Figure 22:
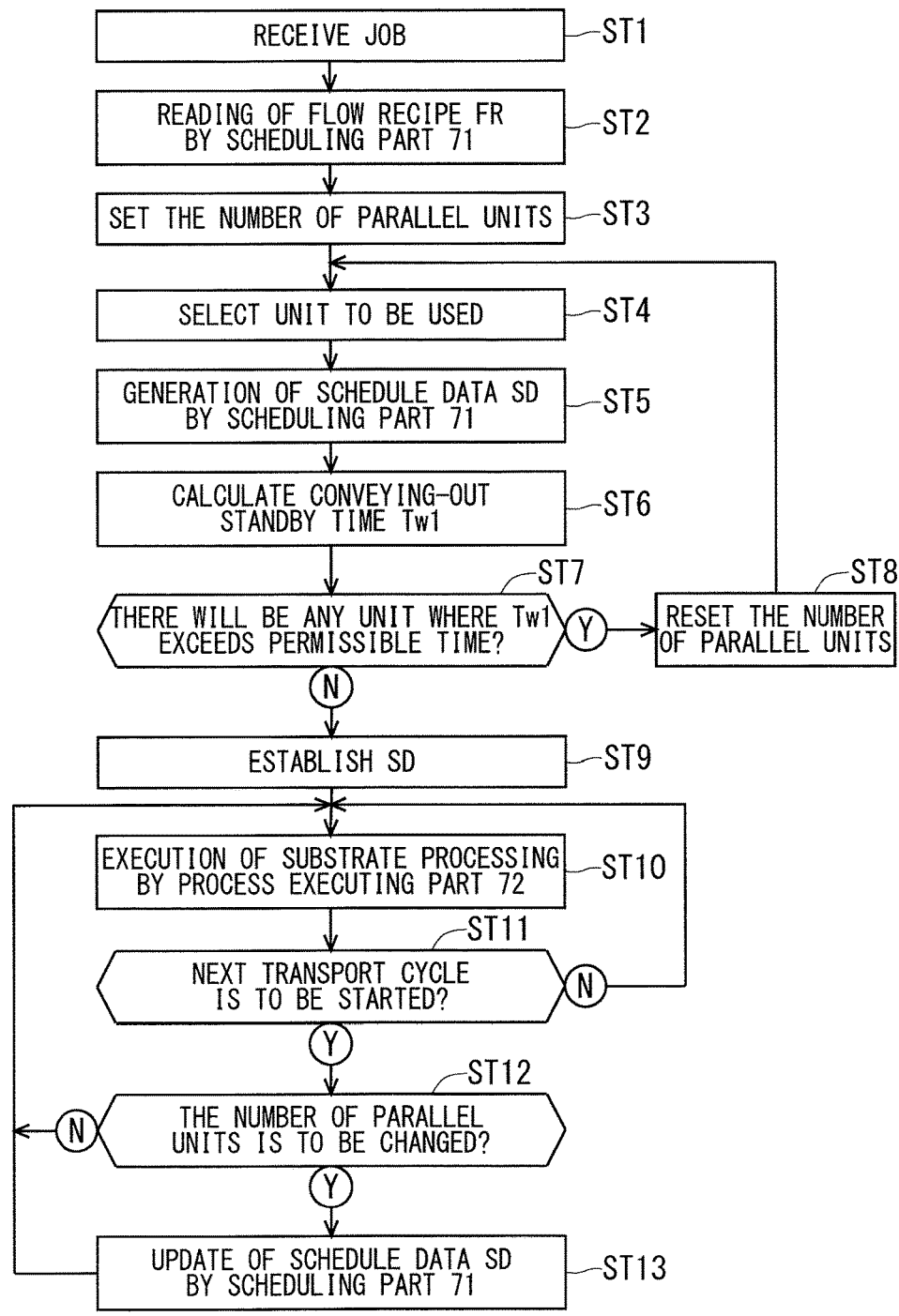
FIG. 22 is a flowchart showing a flow of substrate processing according to a second preferred embodiment.

FIG. 22 is a flowchart showing a flow of substrate processing in the second preferred embodiment. The second preferred embodiment features feedback control of reconsidering the number of parallel units after substrate processing is started.

In the substrate processing of the second preferred embodiment, like in the first preferred embodiment, the schedule data SD is established as a result of the processes in steps ST1 to ST9. Next, the process executing part 72 executes the substrate processing (step ST10). A substrate processing schedule made herein defines that the number of units to be used for parallel processing is "3" and the cleaning units SS1 to SS3 are to be used for the parallel processing. Specifically, as shown in the timing diagram of FIG. 23, a first transport cycle is executed using the cleaning units SS1 to SS3. In the first transport cycle, three substrates W1, W2, and W3 are processed in parallel by the three cleaning units SS1 to SS3.

Immediately before the time (time t7) has come to start a second transport cycle (at a time when a result "Yes" is given in step ST11), it is determined whether the number of parallel units should be changed (step ST12). Here, the necessity to change the number of parallel units is determined according to the following idea.

In step ST12, it is assumed that the number of parallel units is changed to "4" for the second transport cycle and an conveying-out standby time is calculated that is to elapse in this case in each of the cleaning units SS1 to SS4. If the conveying-out standby time is confirmed not to exceed a permissible time with the use of the cleaning units SS1 to SS4, the number of cleaning units to be used in parallel is increased from "3" to "4" to update schedule data (step ST13).

Figure 23:
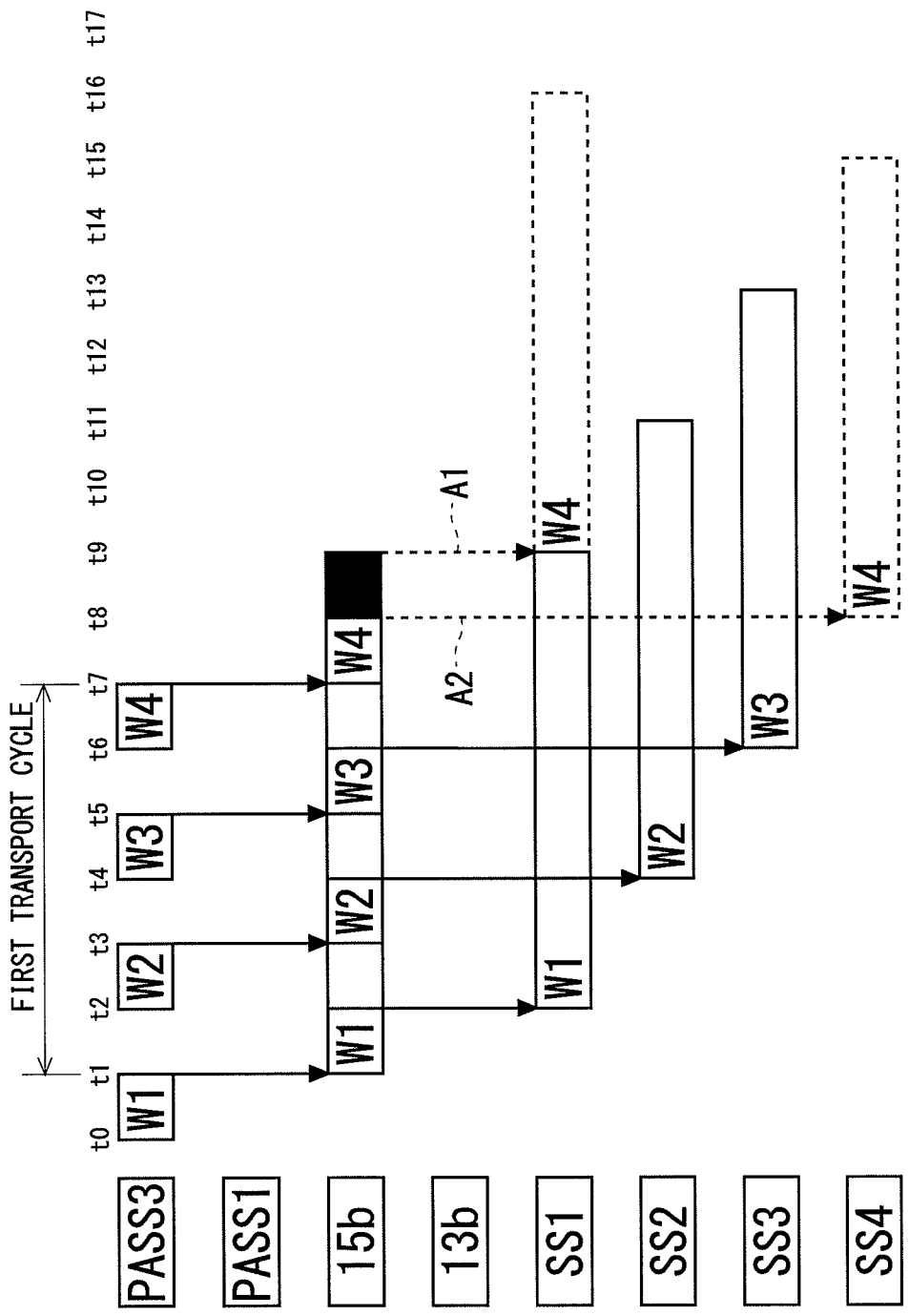
FIG. 23 is a timing diagram showing an idea of changing a substrate processing schedule according to the second preferred embodiment.

In this case, unlike an arrow A1 of FIG. 23, a first substrate W4 in the second transport cycle is not transported from the hand 15b to the cleaning unit SS1 at time t9 but it is transported from the hand 15b to the cleaning unit SS4 as shown by an arrow A2. Then, remaining three substrates W5, W6, and W7 in the second transport cycle are transported sequentially to the cleaning units SS1, SS2, and SS3. In this way, in the second transport cycle, the four cleaning units SS4, SS1, SS2, and SS3 are used for the parallel processing.

As described above, in the second preferred embodiment, as many cleaning units SS (SSR) as possible are used for the parallel processing in each transport cycle within a range that does not make a conveying-out standby time exceed a permissible time. This can prevent re-contamination of a processed substrate effectively while maintaining a high throughput.

Third Preferred Embodiment

A third preferred embodiment is descried next using FIGS. 24 to 27. Like the second preferred embodiment, the third preferred embodiment is intended to consider the possibility of changing the schedule data SD as occasion arises in parallel with actual execution of substrate processing. In the third preferred embodiment, while a preceding job (a first job following the first pattern "cleaning of only front surface") is executed, a subsequent job (a second job following the third pattern "cleaning of both surfaces (rear surface first and then front surface)") is given from the host computer to the controller 60.

Figure 24:
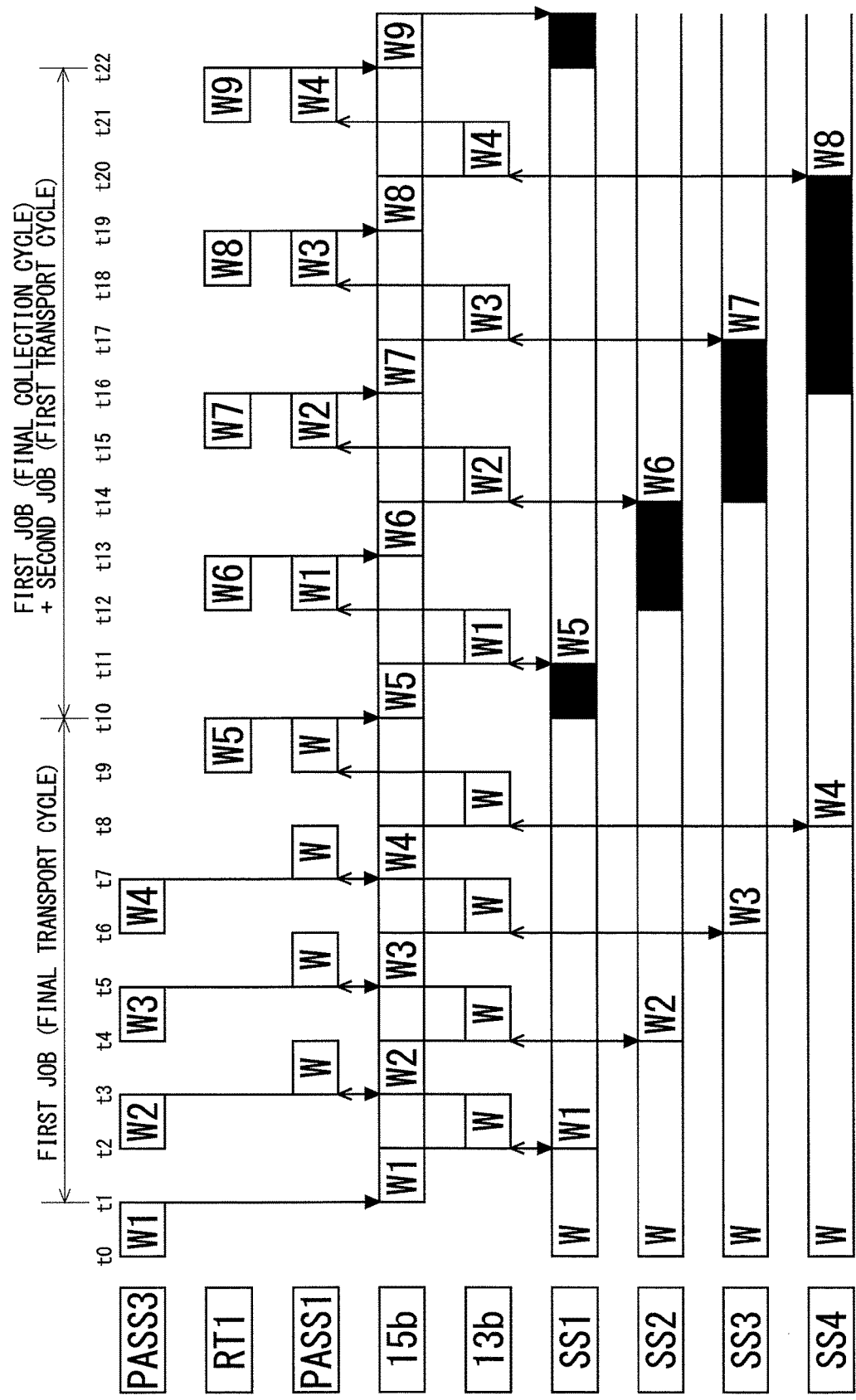

FIGS. 24 and 25 show a timing diagram relating to substrate processing executed at a time when the first job is switched to the second job. For the convenience of illustration, one timing diagram is divided into FIGS. 24 and 25 (FIG. 24 shows process from time t0 to time t22 and FIG. 25 shows process from time t22 to time t34). According to this timing diagram, a transport step is executed first to transport substrates W1 to W4 in a final group of the first job to the corresponding cleaning units SS1 to SS4 (final transport cycle of first job) (from time t1 to time t10 of FIG. 24). Next, a collection step is executed to collect the substrates W1 to W4 from the corresponding cleaning units SS1 to SS4 (final collection cycle of first job). In parallel with this collection step, a transport step is executed to transport substrates W5 to W8 in a first group of the second job to the corresponding cleaning units SS1 to SS4 (first transport cycle of second job) (from time t10 to time t22 of FIG. 24). Next, a second transport cycle of the second job is executed (from time t22 to time t34 of FIG. 25).

The first job corresponds to substrate processing following the first pattern "cleaning of only front surface" in FIG. 15. According to the pattern "cleaning of only front surface," a substrate W processed by the cleaning unit SS is taken out with the hand 13b of the center robot CR (a transition from the processing segment S5 to the segment S6 of FIG. 15; time t2 of FIG. 24) and is then moved to a position facing the substrate placement part PASS1 (the processing segment S6 of FIG. 15; a period from time t2 to time t3 of FIG. 24). Then, this substrate W is transferred to the substrate placement part PASS1 (a transition from the processing segment S6 to the segment S11 of FIG. 15; time t3 of FIG. 24).

Almost simultaneously with this transfer, the unprocessed substrate W2 on the substrate placement part PASS3 is taken out with the hand 15b of the center robot CR (a transition from the processing segment S3 to the segment S4 of FIG. 15; time t3 of FIG. 24). Next, the center robot CR moves to a position facing the cleaning unit SS (the processing segment S4 of FIG. 15; a period from time t3 to time t4 of FIG. 24).

In this way, the center robot CR moves back and forth between the cleaning unit SS and the substrate placement parts PASS1 and PASS3 (in a period from time t2 to time t4 of FIG. 24).

The substrate placement parts PASS1 and PASS3 placed one above the other are close to each other (see FIGS. 14A to 14C). This does not require the center robot CR to move largely in the vertical direction for taking an unprocessed substrate W out of the substrate placement part PASS3 with the hand 15b after transferring a processed substrate W to the substrate placement part PASS1 with the hand 13b. As a result, the center robot CR is to move back and forth at a relatively high speed between the cleaning unit SS and the substrate placement parts PASS1 and PASS3.

The second job corresponds to substrate processing following front surface cleaning of the third pattern "cleaning of both surfaces (rear surface first and then front surface)" in FIG. 15. In this process, the substrate W5 processed by the cleaning unit SS (the processing segment S9 of FIG. 15) is taken out with the hand 13b of the center robot CR (a transition from the processing segment S9 to the segment S10 of FIG. 15; time t23 of FIG. 25) and is moved to a position facing the substrate placement part PASS1 (the processing segment S10 of FIG. 15; a period from time t23 to time t24 of FIG. 25). Then, the substrate W5 is transferred to the substrate placement part PASS1 (a transition from the processing segment S10 to the segment S11 of FIG. 15; time t24 of FIG. 25).

Next, the center robot CR moves up to a position facing the reversing unit RT1. Then, the center robot CR takes a substrate W10 out of the reversing unit RT1 with the hand 15b (a transition from the processing segment S7 to the segment S8 of FIG. 15; time t25 of FIG. 25). The center robot CR thereafter moves to a position facing the cleaning unit SS (the processing segment S8 of FIG. 15; a period from time t25 to time t26 of FIG. 25). In this way, the center robot CR moves back and forth between the cleaning unit SS, the reversing unit RT1, and the substrate placement part PASS1 (in a period from time t23 to time t26 of FIG. 25).

The substrate placement part PASS1 and the reversing unit RT1 are different members largely separated one above the other (see FIG. 2). This requires the center robot CR to move largely in the vertical direction for taking a substrate W out of the reversing unit RT1 with the hand 15b after transferring a substrate W to the substrate placement part PASS1 with the hand 13b (in a period from time t24 to time t25 of FIG. 25). As a result, the center robot CR is to take a relatively long time to move back and forth between the cleaning unit SS, the reversing unit RT1, and the substrate placement part PASS1.

As described above, the center robot CR takes a longer time to move back and forth between the intermediary section 50 (reversing unit RT1, substrate placement part PASS, and reversing and transferring unit RT2) and the cleaning unit SS in the second job than in the first job.

If it is assumed that the center robot CR takes a constant time to move back and forth between the intermediary section 50 and the cleaning unit SS, the length of a conveying-out standby time will not differ among the cleaning units SS. However, a longer time required by the center robot CR to move back and forth between the intermediary section 50 and the cleaning unit SS makes the length of a conveying-out standby time longer in a cleaning unit SS from which a substrate is to be transported later.

As an example, a conveying-out standby time in the first cleaning unit SS1 corresponds to a period from time t10 to time t11 of FIG. 24. Meanwhile, a conveying-out standby time becomes longer in a cleaning unit SS from which a substrate is to be transported later as follows: a period from time t12 to time t14 in the second cleaning unit SS2; a period from time t14 to time t17 in the third cleaning unit SS3; and a period from time t16 to time t20 in the fourth cleaning unit SS4.

In this way, a conveying-out standby time becomes longer in proportion to the number of parallel units. This causes the fear of more serious degradation of cleaning quality of a substrate W in a substrate processing unit SS from which the substrate W is to be transported later as the substrate W is exposed to mist in this unit for a longer time.

Thus, in the third preferred embodiment, before a final transport cycle of a preceding job is executed, a conveying-out standby time of a substrate relating to the preceding job is predicted that is determined if a final transport cycle of the preceding job and a first transport cycle of a subsequent job are executed in parallel. If the conveying-out standby time relating to the preceding job is predicted to exceed a given permissible time, the substance of a final collection cycle of the preceding job is changed. More specifically, the number of parallel units in the first transport cycle of the subsequent job is reduced that is to be executed simultaneously with the final collection cycle of the preceding job.

FIG. 26 is a flowchart showing a flow of substrate processing in the third preferred embodiment. Steps ST1 to ST9 of this flow are the same as those of the aforementioned flow of the second preferred embodiment, so that they will not be described again. In the third preferred embodiment, the scheduling part 71 monitors addition of a new job (step ST11) in parallel with execution of substrate processing by the process executing part 72 (step ST10). Step ST12 is executed in response to addition of a new job. In step ST12, the aforementioned processes in steps S2 to S9 are performed to temporarily determine the schedule data SD to be used for execution of the next job. In the example of FIG. 24, a substrate processing schedule of the additional job (second job) is made while setting the number of units for parallel processing to "4."

Next, the scheduling part 71 generates the schedule data SD (step ST13) determined when a final collection cycle of collecting a substrate having been transported in a final transport cycle of a job being executed (first job) and a first transport cycle of a next job (second job) are executed in parallel. As a result, a substrate transport schedule relating to a period from time t10 to time t22 of FIG. 24 is made. In this period, in parallel with collection of the substrates W1 to W4 for the first job to the substrate placement part PASS1, the substrates W5 to W8 for the first transport cycle of the second job are supplied in turn to the cleaning units SS1 to SS4 respectively.

Next, the scheduling part 71 determines whether there will be a cleaning unit SS causing an conveying-out standby time in which exceeds a permissible time in the period from time t10 to time t22 by referring to the schedule data SD generated in step ST12 (step ST14). If there will be no cleaning unit SS the conveying-out standby time in which exceeds the permissible time, a result of the determination in step ST14 becomes "No." Then, in step ST10, the final collection cycle of the first job and the first transport cycle of the second job are executed simultaneously according to the schedule data SD generated in steps ST12 and ST13.

Figure 27:
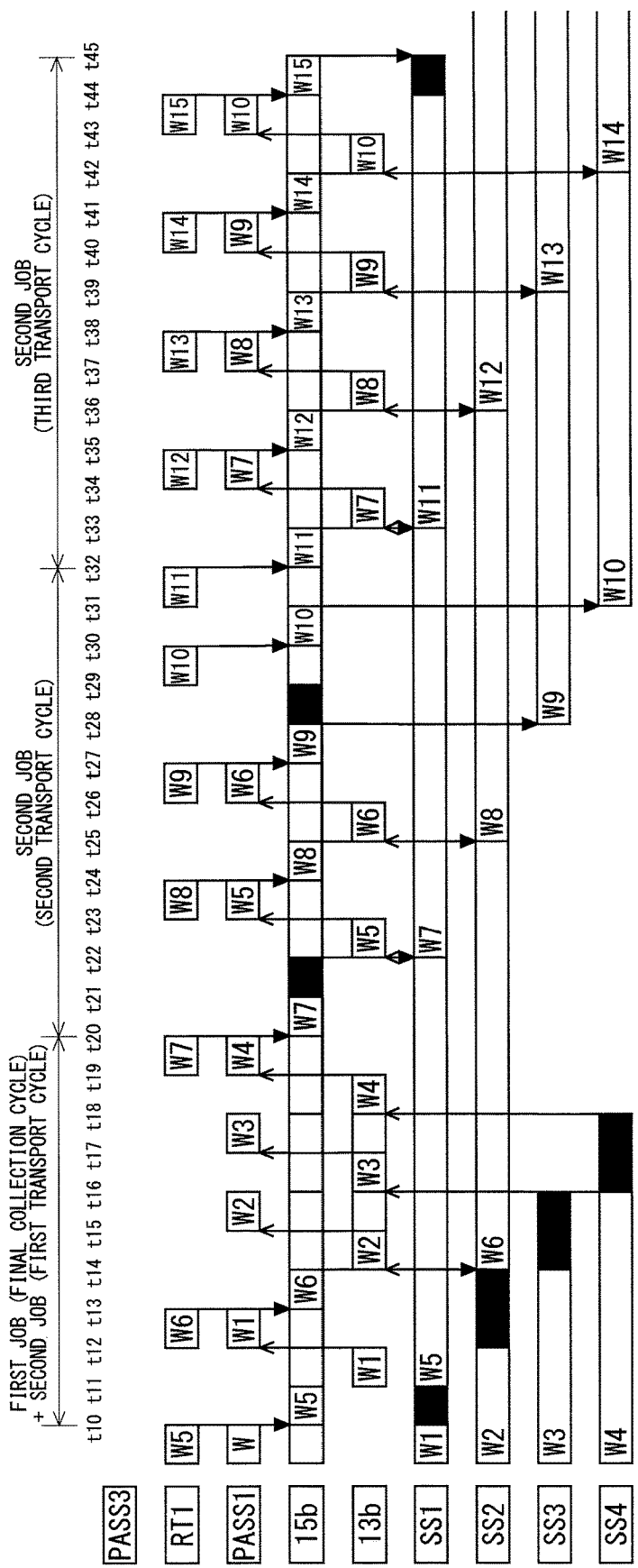
FIG. 27 is a timing diagram showing an exemplary schedule according to the third preferred embodiment.

If a result of the determination in step ST14 is "Yes," the number of units for parallel processing in the first transport cycle of the second job is reduced to change the final collection cycle of the first job (step ST15). As shown in FIG. 27, for example, the number of units for parallel processing in the first transport cycle of the second job (from time t10 to time t20) is reduced from "4" to "2." This changes substrate processing in the final collection cycle of the first job.

More specifically, according to the original substrate processing schedule shown in FIG. 24, after the substrate W2 relating to the first job is transported to the substrate placement part PASS1 (time t15), the third substrate W7 relating to the first transport cycle of the second job is transported from the reversing unit RT1 (time t16). In contrast, a schedule is changed as shown in the substrate processing schedule of FIG. 27 such that after the substrate W2 relating to the first job is transported to the substrate placement part PASS1 (time t15), the third substrate W3 relating to the final collection cycle of the first job is collected from the cleaning unit SS3 (time t16 of FIG. 27) instead of starting transport of the substrate W7 relating to the second job.

The schedule is also changed such that the fourth substrate W4 relating to the final collection cycle of the first job is collected from the cleaning unit SS4 (time t18 of FIG. 27) instead of transporting the fourth substrate W8 relating to the first transport cycle of the second job from the reversing unit RT1 (time t19 of FIG. 24).

In this way, the final collection cycle of the first job is changed so as to advance the timing of collecting the third and fourth substrates W3 and W4 relating to the final collection cycle. This makes it possible to shorten a conveying-out standby time in the cleaning units SS3 and SS4. As a result, degradation of cleaning quality of the substrates W3 and W4 in the units SS3 and SS4 respectively can be suppressed or prevent.

In response to the aforementioned change in the final collection cycle of the first job made in step ST15, the substrate processing schedule of the second job made in step ST13 is corrected (step ST16 of FIG. 26). According to the schedule data SD thereby established, the first transport cycle of the second job is executed in parallel with the final collection cycle of the first job (from time t10 to time t20). Then, a second transport cycle of the second job (from time t20 to time t32) and a third transport cycle of the second job (from time t32 to time t45) are executed in turn (step ST10).

As described above, the substrate processing apparatuses of the first to third preferred embodiments can prevent a substrate W after subjected to substrate processing from being left unattended in the cleaning unit SS (SSR) for a time longer than necessary. This prevents exposure of the substrate W to mist of a cleaning liquid or the like in the cleaning unit SS (SSR) for a long time, thereby assuring high substrate processing performance.

In particular, like in the substrate processing apparatuses of the second and third preferred embodiments, correcting a substrate processing schedule in parallel with substrate processing can always update the substance of the substrate processing schedule.

In the substrate processing apparatus of the third preferred embodiment, to comply with timing of switching a job, a substrate relating to a preceding job and after subjected to cleaning process can be prevented from being left unattended in a cleaning unit for a long time.

The center robot CR described in the first to third preferred embodiments is to transport one unprocessed substrate W and one processed substrate W. Alternatively, the feasibility of the present invention is still maintained if the center robot CR transports two unprocessed substrates W at the same time and two processed substrates W at the same time (see FIGS. 7A and 7B).

In the first to third preferred embodiments, a scrub cleaning apparatus is described as an example of the substrate processing apparatus 1 configured to make a schedule. However, the substrate processing apparatus 1 of the present invention is not limited to a scrub cleaning apparatus but it can be used as various substrate processing apparatuses including a sheet-type substrate cleaning apparatus not using a brush for cleaning, a cooling apparatus and a drying apparatus, for example.

While the invention has been described in detail, the foregoing description is in all aspects illustrative and not restrictive. It is therefore understood that numerous modifications and variations can be devised without departing from the scope of the invention.

What is claimed is:

1. A substrate processing apparatus with multiple substrate processing units available in parallel comprising:
   a substrate transporting part that transports a substrate to said multiple substrate processing units and transports a substrate after being subjected to substrate processing from said multiple substrate processing units,
   a schedule making part that, prior to starting one transport cycle for transporting multiple substrates in order by said substrate transporting part toward all of two or more substrate processing units to be used in parallel:
   (a) calculates a first conveying-out standby time for each of said two or more substrate processing units, when one or more transport cycle is executed, based on a first substrate processing schedule for performing processing by said substrate transporting part of transporting multiple substrates in order toward all of two or more substrate processing units to be used in parallel, substrate processing by said two or more substrate processing units to be used in parallel, and processing by said substrate transporting part of transporting multiple substrates in order from all of said two or more substrate processing units to be used in parallel, said first conveying-out standby time being a time when a substrate, after being subjected to substrate processing by a substrate processing unit of said multiple substrate processing units, is placed in standby until said substrate is transported from said substrate processing unit by said substrate transporting part,
   (b) reduces the number of said two or more substrate processing units to be used in parallel in response to the determination that there will be a substrate processing unit in which said first conveying-out standby time exceeds a given permissible time, and makes a second substrate processing schedule for performing processing by said substrate transporting part of transporting multiple substrates in order toward all of said two or more substrate processing units to be used in parallel, substrate processing by said two or more substrate processing units to be used in parallel, and processing by said substrate transporting part of transporting multiple substrates in order from all of said two or more substrate processing units,
   (c) calculates a second conveying-out standby time for each of said two or more substrate processing units, when one or more transport cycle is executed, based on said second substrate processing schedule, said second conveying-out standby time being a time when a substrate, after subjected to substrate processing by said substrate processing unit, is placed in standby until said substrate is transported from said substrate processing unit by said substrate transporting part, and (d) determines said second substrate processing schedule in response to the determination that there will not be a substrate processing unit causing the second conveying-out standby time to exceed said given permissible time; and a controller that controls said two or more substrate processing units to be used in parallel and said substrate transporting part to execute substrate processing on multiple substrates in order according to said second substrate processing schedule.

2. The substrate processing apparatus according to claim 1, wherein said substrate transporting part is configured to transport multiple substrates in order to said two or more substrate processing units to be used in parallel, and while said controller controls said multiple substrate processing units and said substrate transporting part according to a substrate processing schedule for defining said transport cycle to be repeated when a substrate is transported to each of said two or more substrate processing units to be used in parallel, said schedule making part makes said second substrate processing schedule for performing a subsequent transport cycle during execution of a preceding transport cycle and before start of said subsequent transport cycle.

3. The substrate processing apparatus according to claim 2, further comprising a substrate supporting part that supports said substrate, wherein said substrate transporting part is configured to move back and forth between said substrate supporting part supporting said substrate and said multiple substrate processing units, and said schedule making part sets a second number to be smaller than a first number and makes said second substrate processing schedule based on said second number if said substrate transporting part executes said preceding transport cycle and said subsequent transport cycle continuously and if said substrate transporting part takes a longer time to move back and forth between said substrate supporting part and said multiple substrate processing units in said subsequent transport cycle than in said preceding transport cycle, said first number being the number of two or more substrate processing units to be used in parallel in said preceding transport cycle, said second number being the number of two or more substrate processing units to be used in parallel in said subsequent transport cycle.

4. The substrate processing apparatus according to claim 1, wherein said multiple substrate processing units includes a substrate cleaning unit that cleans said substrate.

5. The substrate processing apparatus according to claim 4, wherein said multiple substrate processing units include a front surface cleaning unit that cleans a front surface of said substrate and a rear surface cleaning unit that cleans a rear surface of said substrate, and said permissible time defined in a substrate processing schedule for performing substrate processing using said rear surface cleaning unit is set to be shorter than said permissible time defined in a substrate processing schedule for performing substrate processing using said front surface cleaning unit.

6. A substrate processing method implemented in a substrate processing apparatus with multiple substrate processing units available in parallel and a substrate transporting part that transports a substrate to said multiple substrate processing units and transports a substrate after subjected to substrate processing from said multiple substrate processing units, the substrate processing method comprising the steps of:

using a controller and calculating, prior to starting of one transport cycle for transporting multiple substrates in order by said substrate transporting part toward all of two or more substrate processing units to be used in parallel, a first conveying-out standby time for each of said two or more substrate processing units, when one or more transport cycle is executed, based on a first substrate processing schedule for performing processing by said substrate transporting part of transporting multiple substrates in order toward all of two or more substrate processing units to be used in parallel, substrate processing by said two or more substrate processing units to be used in parallel, and processing by said substrate transporting part of transporting multiple substrates in order from all of said two or more substrate processing units to be used in parallel, said first conveying-out standby time being a time when a substrate after subjected to substrate processing by a substrate processing unit of said multiple substrate processing units is placed in standby until said substrate is transported from said substrate processing unit by said substrate transporting part, using said controller and reducing the number of said two or more substrate processing units to be used in parallel according to said one transport cycle in response to the determination that there will be a substrate processing unit in which said first conveying-out standby time exceeds a given permissible time, and making a second substrate processing schedule for performing processing by said substrate transporting part of transporting multiple substrates in order toward all of said substrate processing units to be used in parallel, substrate processing by said two or more substrate processing units to be used in parallel, and processing by said substrate transporting part of transporting multiple substrates in order from all of said two or more substrate processing units, using said controller and calculating a second conveying-out standby time for each of said two or more substrate processing units, when one or more transport cycle is executed, based on said second substrate processing schedule, said second conveying-out standby time being a time when a substrate after subjected to substrate processing by said substrate processing unit is placed in standby until said substrate is transported from said substrate processing unit by said substrate transporting part;

using said controller and determining said second substrate processing schedule in response to the determination that there will not be a substrate processing unit causing the second conveying-out standby time which exceeds said given permissible time; and using said controller and controlling said two or more substrate processing units to be used in parallel and said substrate transporting part to execute substrate processing on multiple substrates in order according to said second substrate processing schedule.

7. The substrate processing method according to claim 6, wherein said substrate transporting part is configured to transport multiple substrates in order to said two or more substrate processing units to be used in parallel, and while said multiple substrate processing units and said substrate transporting part are controlled according to a substrate processing schedule for defining said transport cycle to be repeated when a substrate is transported to each of said two or more substrate processing units to be used in parallel, said second substrate processing schedule for performing a subsequent transport cycle is made, using said controller, during execution of a preceding transport cycle and before starting of said subsequent transport cycle.

8. The substrate processing method according to claim 7, wherein
said substrate transporting part is to move back and forth between a substrate supporting part supporting said substrate and said multiple substrate processing units, and
a second number is set, using said controller, to be smaller than a first number and said second substrate processing schedule is made, using said controller, based on said second number if said substrate transporting part executes said preceding transport cycle and said subsequent transport cycle continuously and if said substrate transporting part takes a longer time to move back and forth between said substrate supporting part and said multiple substrate processing units in said subsequent transport cycle than in said preceding transport cycle, said first number being the number of two or more substrate processing units to be used in parallel in said preceding transport cycle, said second number being the number of two or more substrate processing units to be used in parallel in said subsequent transport cycle.

9. The substrate processing method according to claim 6, wherein said substrate processing unit includes a substrate cleaning unit that cleans a substrate.

10. The substrate processing method according to claim 9, wherein
said multiple substrate processing units include a front surface cleaning unit that cleans a front surface of said substrate and a rear surface cleaning unit that cleans a rear surface of said substrate, and
said permissible time defined in a substrate processing schedule for performing substrate processing using said rear surface cleaning unit is set, using said controller, to be shorter than said permissible time defined in a substrate processing schedule for performing substrate processing using said front surface cleaning unit.

11. A substrate processing method implemented in a substrate processing apparatus with multiple substrate processing units available in parallel and a substrate transporting part that transports a substrate to and from said multiple substrate processing units, the substrate processing method comprising the steps of:

(A) using a controller and setting, prior to starting of one transport cycle for transporting multiple substrates in order by said substrate transporting part toward all of two or more substrate processing units to be used in parallel, the number of said two or more substrate processing units to be used in parallel so as to produce a transport rate limiting condition where the length of a staying time of said substrate in each of said substrate processing units does not exceed time required for said one transport cycle by said substrate transporting part, when one or more transport cycle is executed;

(B) using said controller and making a first substrate processing schedule for performing processing by said substrate transporting part of transporting multiple substrates in order toward all of two or more substrate processing units to be used in parallel, substrate processing by said two or more substrate processing units to be used in parallel, and processing by said substrate transporting part of transporting multiple substrates in order from all of said two or more substrate processing units to be used in parallel, based on the number of said substrate processing units to be used in parallel set in said step (A);

(C) using said controller and calculating a first conveying-out standby time for each of said two or more substrate processing units, when one or more said transport cycle is executed, based on said first substrate processing schedule, said first conveying-out standby time being a time when a substrate after subjected to substrate processing by a substrate processing unit of said multiple substrate processing units according to said substrate processing schedule is placed in standby until said substrate is transported from said substrate processing unit by said substrate transporting part;

(D) using said controller and resetting the number of said two or more substrate processing units to be used in parallel according to said one transport cycle in response to the determination that there will be a substrate processing unit in which said first conveying-out standby time exceeds a given permissible time and making a second substrate processing schedule for performing processing by said substrate transporting part of transporting multiple substrates in order toward all of two or more substrate processing units to be used in parallel, substrate processing by said two or more substrate processing units to be used in parallel, and processing by said substrate transporting part of transporting multiple substrates in order from all of said two or more substrate processing units to be used in parallel, based on the reset number of two or more substrate processing units to be used in parallel; and (E) using said controller and calculating a second conveying-out standby time for each of said two or more substrate processing units, when one or more said transport cycle is executed, based on said second substrate processing schedule, said second conveying-out standby time being a time when a substrate after subjected to substrate processing by said substrate processing unit is placed in standby until said substrate is transported from said substrate processing unit by said substrate transporting part;

(F) using said controller and determining said second substrate processing schedule in response to the determination that there will not be a substrate processing unit causing the second conveying-out standby time which exceeds said given permissible time; and (G) using said controller and controlling said two or more substrate processing units to be used in parallel and said substrate transporting part to execute substrate processing on multiple substrates in order according to said second substrate processing schedule determined in said step (F).

* * * * *